(12) United States Patent
Kumon et al.

(10) Patent No.: US 9,481,858 B2
(45) Date of Patent: Nov. 1, 2016

(54) SILICON WAFER CLEANING AGENT

(71) Applicant: Central Glass Company, Limited, Ube-shi, Yamaguchi (JP)

(72) Inventors: Soichi Kumon, Matsusaka (JP); Masanori Saito, Matsusaka (JP); Takashi Saio, Suzuka (JP); Hidehisa Nanai, Tokyo (JP); Yoshinori Akamatsu, Matsusaka (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 14/574,838

(22) Filed: Dec. 18, 2014

(65) Prior Publication Data

US 2015/0101643 A1    Apr. 16, 2015

Related U.S. Application Data

(60) Division of application No. 12/882,898, filed on Sep. 15, 2010, now Pat. No. 8,957,005, which is a continuation-in-part of application No. PCT/JP2010/050390, filed on Jan. 15, 2010.

(30) Foreign Application Priority Data

| Jan. 21, 2009 | (JP) | ................................ | 2009-011128 |
| Jan. 21, 2009 | (JP) | ................................ | 2009-011129 |
| Dec. 25, 2009 | (JP) | ................................ | 2009-293916 |
| Dec. 25, 2009 | (JP) | ................................ | 2009-293953 |

(51) Int. Cl.
*H01L 21/02* (2006.01)
*H01L 21/306* (2006.01)
(Continued)

(52) U.S. Cl.
CPC ............. *C11D 11/0047* (2013.01); *C11D 7/30* (2013.01); *C11D 7/3209* (2013.01); *C11D 11/007* (2013.01); *C11D 11/0064* (2013.01); *H01L 21/02052* (2013.01)

(58) Field of Classification Search
CPC ............. H01L 21/02; H01L 21/02041; H01L 21/306; C11D 3/162; C11D 7/30; C11D 7/32
See application file for complete search history.

(56) References Cited

U.S. PATENT DOCUMENTS

| 5,326,672 A | 7/1994 | Tanaka et al. |
| 5,374,502 A | 12/1994 | Tanaka et al. |

(Continued)

FOREIGN PATENT DOCUMENTS

| JP | 5-299336 A | 11/1993 |
| JP | 2000-19744 A | 1/2000 |

(Continued)

OTHER PUBLICATIONS

International Search report including English translation dated Apr. 20, 2010 and PCT/ISA/237 Form (Six (6) pages).

(Continued)

*Primary Examiner* — Brian P Mruk
(74) *Attorney, Agent, or Firm* — Crowell & Moring LLP

(57) ABSTRACT

A silicon wafer cleaning agent includes at least a water-based cleaning liquid, and a water-repellent cleaning liquid for providing water-repellent to an uneven pattern at least at recessed portions during a cleaning process. The water-repellent cleaning liquid is a liquid composed of a water-repellent compound containing a reactive moiety which is chemically bondable to Si in the silicon wafer, and a hydrophobic group, or is a liquid wherein 0.1 mass % or more of the water-repellent compound relative to the total quantity of 100 mass % of the water-repellent cleaning liquid and an organic solvent are mixed and contained therein. A cleaning process wherein a pattern collapse is easily induced can be improved by using the cleaning agent.

8 Claims, 2 Drawing Sheets

(51) Int. Cl.
*C11D 7/30* (2006.01)
*C11D 7/32* (2006.01)
*C11D 11/00* (2006.01)

(56) References Cited

U.S. PATENT DOCUMENTS

| | | | |
|---|---|---|---|
| 7,749,909 B2 | 7/2010 | Tomita et al. | |
| 2004/0013858 A1* | 1/2004 | Hacker | H01L 21/02063 428/195.1 |
| 2007/0082491 A1 | 4/2007 | Uozumi et al. | |
| 2008/0241489 A1 | 10/2008 | Ishibashi et al. | |
| 2009/0311874 A1 | 12/2009 | Tomita et al. | |
| 2010/0075504 A1 | 3/2010 | Tomita et al. | |
| 2010/0122711 A1* | 5/2010 | Ryan | C11D 7/08 134/2 |

FOREIGN PATENT DOCUMENTS

| | | |
|---|---|---|
| JP | 2007-134690 A | 5/2007 |
| JP | 2007-214447 A | 8/2007 |
| JP | 2008-198958 A | 8/2008 |
| WO | WO 2006/138505 A1 | 12/2006 |
| WO | WO 2010/047196 A1 | 4/2010 |

OTHER PUBLICATIONS

Corresponding Korean Office Action dated Nov. 29, 2010 with Japanese language translation (Eleven (11) pages).

"Testing Method of Wettability of Glass Substrate", Japanese Industrial Standard R 3257:1999, Mar. 20, 1999 (Sixteen (16) pages).

JIS Handbook, "Machine Elements: Basics (Drawing Practice Symbols), Basic (Tolerance and Machining Accuracy), Shape of Machine Parts, Others, Screw Threads, Pins, Rivets, Shafts, Rolling Bearings", Japanese Standards Association B-0601, 2003, (Sixteen (16) pages).

Taiwanese Office Action with Japanese translation dated Dec. 5, 2012 (ten 10) pages).

* cited by examiner

SILICON WAFER CLEANING AGENT

CROSS REFERENCE TO RELATED APPLICATIONS

The application is a divisional of U.S. patent application Ser. No. 12/882,898, filed Sep. 15, 2010, now U.S. Pat. No. 8,957,005, issued Feb. 17, 2015, which is a Continuation in-part of PCT International Application No. PCT/JP2010/050390, filed Jan. 15, 2010, which claims priority under 35 U.S.C. §119 from Japanese Patent Application Nos. 2009-293953, filed Dec. 25, 2009, 2009-293916, filed Dec. 25, 2009, 2009-011129, filed Jan. 21, 2009, and 2009-011128, filed Jan. 21, 2009, the entire disclosures of which are expressly incorporated by reference herein.

TECHNICAL FIELD

The present invention relates to a technique of cleaning a silicon substrate (a wafer) in production of semiconductor devices, the purpose of which being production yield improvements of devices having such a circuit pattern as to be particularly fine and to be a particularly high aspect ratio.

BACKGROUND OF THE INVENTION

Semiconductor devices for use of network or digital household electric appliances are being further desired to be sophisticated, multifunctional and low in power consumption. Accordingly, the trend toward micro-scale circuit pattern has been developed, with which micro-sizing of particles is advanced so as to cause reduction in production yield. As a result of this, a cleaning process for the purpose of removing the micro-sized particles is frequently used. As a result of this, 30-40% of the whole of the fabrication process is occupied with the cleaning process.

On the other hand, in a cleaning conventionally performed with a mixed ammonia cleaning agent, damages to the wafer due to its basicity becomes more significant with the trend toward micro-scale pattern circuit. Therefore, alternation with a dilute hydrofluoric acid-based cleaning agent is taking place.

With this, the problems about the damages to the wafer due to cleaning have been solved; however, problems due to an aspect ratio increased with the trend toward micro-scale pattern in the semiconductor devices have become obvious. In other words, a phenomenon where the pattern collapses when a gas-liquid interface passes through the pattern is brought about after cleaning or rinsing thereby largely reducing the yield, which has become a significant problem.

The pattern collapse occurs at the time of taking the wafer out of a cleaning liquid or a rinsing liquid. It is said that the reason thereof is that a difference in height of residual liquid between a part of high aspect ratio and a part of low aspect ratio causes a difference in the capillary force which acts on the pattern.

Accordingly, it is expected by decreasing the capillary force that the difference in the capillary force due to the difference in height of residual liquid is reduced thereby resolving the pattern collapse. The magnitude of the capillary force is the absolute value of P obtained by the equation as represented below. It is expected from this equation that the capillary force can be reduced if decreasing γ or cos θ.

$$P = 2 \times \gamma \times \cos\theta / S$$ (γ: Surface tension, θ: Contact angle, S: Pattern width).

In Patent Document 1, a technique of replacing water as a cleaning agent with 2-propanol before the gas-liquid interface passes through the pattern is disclosed as a method of decreasing γ to suppress the pattern collapse. This method is effective for preventing the pattern collapse; however, a solvent having small γ such as 2-propanol and the like is also small in normal contact angle, which results in the trend to increase cos θ. It is therefore said that there are limitations to adaptable patterns, for example, an aspect ratio of not higher than 5.

Additionally, in Patent Document 2, a technique directed to a resist pattern is disclosed as a method for decreasing cos θ to suppress the pattern collapse. This method is a method of setting a contact angle to around 90° to bring cos θ close to 0 so as to reduce the capillary force to the limit thereby suppressing the pattern collapse.

However, the thus disclosed technique cannot be applied to the present object, because: it is directed to the resist pattern or for reforming a resist itself; and a final removal together with the resist is possible so as not to need the assumption about a method of removing a treatment agent after drying.

Additionally, the use of a critical fluid, the use of liquid nitrogen or the like are proposed as the method of preventing the pattern collapse in the semiconductor devices. However, any of these needs a treatment in a closed system or a batch in contrast to the conventional cleaning processes and therefore involves issues in view of cost such as throughput, though effective to some extent.

REFERENCES ABOUT PRIOR ART

Patent Publication

Patent Publication 1: Japanese Patent Application Publication No. 2008-198958
Patent Publication 2: Japanese Patent Application Publication No. 5-299336

SUMMARY OF THE INVENTION

In production of semiconductor devices, a surface of a silicon wafer is a surface having a finely uneven pattern. An object of the present invention is to provide a silicon wafer cleaning agent for improving a cleaning process which tends to induce a pattern collapse, in a method of producing the silicon wafer having at its surface a finely uneven pattern.

According to the present invention, there is provided a cleaning agent for a silicon wafer having a finely uneven pattern at its surface (a first cleaning agent), the cleaning agent being characterized in that: the cleaning agent contains at least a water-based cleaning liquid and a water-repellent cleaning liquid for providing at least recessed portion of the uneven pattern with water repellency during a cleaning process; the water-repellent cleaning liquid is a liquid comprising a water-repellent compound having a reactive moiety chemically bondable to Si element in the silicon wafer and a hydrophobic group, or a liquid in which the water-repellent compound of not lower than 0.1 mass % relative to the total quantity of 100 mass % of the water-repellent cleaning liquid and an organic solvent are mixed and contained thereby presenting a capillary force of not higher than 2.1 $MN/m^2$ on the assumption that water is retained in the recessed portion formed at the surface of the silicon wafer provided with water repellency by the water-repellent cleaning liquid.

The water-repellent cleaning agent may be a cleaning agent for a silicon wafer (A second cleaning agent) characterized in that: the water-repellent cleaning liquid is a liquid in which the water-repellent compound and the organic solvent are mixed and contained; the water-repellent compound is mixed and contained therein in such an amount as to be 0.1-50 mass % relative to the total quantity of 100 mass % of the water-repellent cleaning liquid; the organic solvent contains a nitrogen containing solvent; the nitrogen containing solvent is a solvent whose element to be bonded to nitrogen is carbon thereby presenting a capillary force of not higher than 2.1 $MN/m^2$ on the assumption that water is retained in the recessed portion formed at the surface of the silicon wafer provided with water repellency by the water-repellent cleaning liquid.

The following description is a description common between the first cleaning agent and the second cleaning agent, unless specified.

In the cleaning agent of the present invention, each cleaning liquid is mutually independently used, and at least two or more kinds of the cleaning liquids are used.

Additionally, in the present invention, water repellency is used in a sense that a surface energy of a surface of an article is decreased thereby reducing an interaction between water or other liquid and the surface of the article (an interface), such as hydrogen bond, intermolecular forces and the like. The effect of reducing an interaction against water is greatly exhibited; however, the effect of reducing an interaction against a mixture liquid of water and liquid other than water or against liquid other than water is also exhibited. With the reduction of the interaction, it is possible to increase a contact angle of the liquid to the surface of the article.

In cleaning the silicon wafer in which an uneven pattern is formed, the water-based cleaning liquid contained in the silicon wafer cleaning agent of the present invention is provided to the surface of the silicon wafer upon making the surface of the silicon wafer a surface having a finely uneven pattern. Additionally, the water-based cleaning liquid may be provided to the silicon wafer through providing the water-repellent cleaning liquid to the silicon wafer. Furthermore, the water-repellent cleaning liquid and the water-based cleaning liquid may be provided to the surface of the silicon wafer while being substituted with a cleaning liquid different from the cleaning liquids under a condition where the different cleaning liquid is retained in the recessed portion of the surface of the silicon wafer.

The cleaning agent for the silicon wafer of the present invention is comprised of two or more cleaning liquids and is used while substituting a cleaning liquid retained in the recessed portion with another cleaning liquid. The cleaning agent is finally removed from the surface of the silicon wafer.

While the surface of the silicon wafer is cleaned by the cleaning agent for the silicon wafer of the present invention, the recessed portion of the surface of the silicon wafer is to temporarily retain the water-repellent cleaning liquid. With this retention, the recessed portion is brought into a surface condition provided with water repellency by the water-repellent compound.

In the present invention, the water-repellent compound has a reactive moiety chemically bondable to Si element in the silicon wafer, and a hydrophobic group. With this, the surface of the silicon wafer can keep the surface condition provided with water repellency. Since the surface of the recessed portion is under the condition provided with water repellency, the capillary force at the time of removing or drying the cleaning liquid is so reduced that the pattern collapse becomes hard to occur. Additionally, the surface condition provided with water repellency can be removed by irradiating the surface of the silicon wafer with light or heating the silicon wafer.

If the water-repellent compound contained in the water-repellent cleaning liquid is less than 0.1 mass % relative to the total quantity of 100 mass % of the water-repellent cleaning liquid, the surface of the recessed portion cannot sufficiently obtain the surface condition provided with water repellency.

Additionally, the water-repellent cleaning liquid in the first cleaning agent contains a mixture of: the water-repellent compound having a reactive moiety chemically bondable to Si element in the silicon wafer and a hydrophobic group; and the organic solvent, so that the surface of the recessed portion can readily reach the surface condition sufficiently provided with water repellency with a short period of time.

Additionally, the second cleaning agent is those of which element to be bonded to nitrogen is carbon. With this, the surface of the recessed portion can readily reach the surface condition sufficiently provided with water repellency with a short period of time.

DETAILED DESCRIPTION

Figure 1:
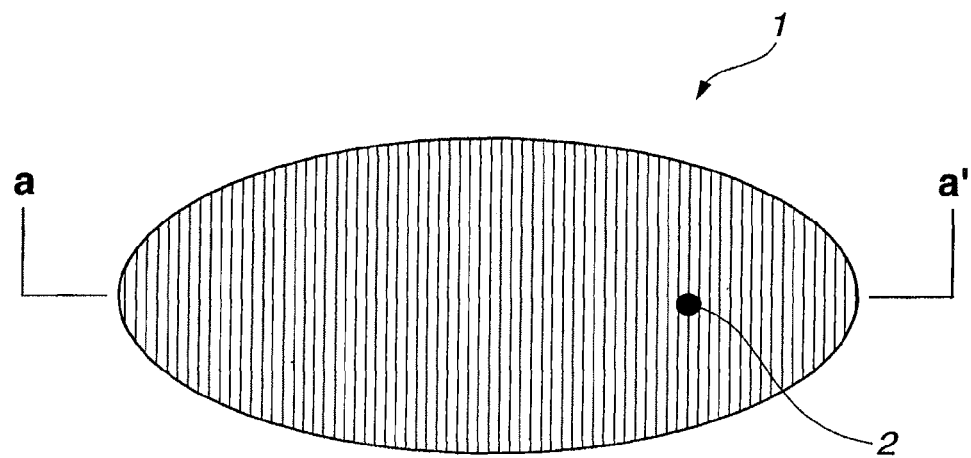
FIG. 1 A schematic plan view of a silicon wafer 1 of which surface is made a surface having a finely uneven pattern 2.

A silicon wafer cleaning agent of the present invention exhibits an excellent pattern collapse-preventability. When using the cleaning agent, therefore, a cleaning process of a production method for a silicon wafer having a finely uneven pattern at its surface is improved without reducing throughput. With this, the productivity of the production method conducted by using the silicon wafer cleaning agent of the present invention on the silicon wafer having the finely uneven pattern at its surface is increased.

The silicon wafer cleaning agent of the present invention is adaptable to uneven patterns with increasingly growing aspect ratios, for example, an aspect ratio of not less than 7, and allows cost reduction in producing more sophisticated semiconductor devices. In addition to this, the agent is adaptable without considerably modifying conventional apparatuses, which results in adaptable one to production of various kinds of semiconductor devices.

A cleaning method for the silicon wafer having the finely uneven pattern at its surface, using the silicon wafer cleaning agent of the present invention, preferably includes:

a step of making a silicon wafer have a surface with a finely uneven pattern, followed by providing a water-based cleaning liquid to the surface and retaining the water-based cleaning liquid in recessed portions;

a step of substituting the water-based cleaning liquid retained in the recessed portions with a cleaning liquid A different from the water-based cleaning liquid;

a step of retaining a water-repellent cleaning liquid in the recessed portions in order to make surfaces of the recessed portions of the uneven pattern have water repellency; and a step of removing the cleaning agent.

Furthermore, after the step of retaining the water-repellent cleaning liquid in the recessed portions, the water-repellent cleaning liquid retained in the recessed portions may be substituted with a cleaning liquid B different from the water-repellent cleaning liquid. Additionally, it is more preferable to take a step of retaining a water-based cleaning liquid comprised of a water-based solution in the recessed portions through the substitution with the different cleaning liquid.

Additionally, the step of removing the cleaning agent includes:

a step of removing the cleaning liquid retained in the recessed portions from the recessed portions by drying; and a step of irradiating the surface of the silicon wafer with light or heating the silicon wafer.

Additionally, in the step of removing the cleaning agent, between the step of removing the cleaning liquid retained in the recessed portions from the recessed portions by drying and the step of irradiating the surface of the silicon wafer with light or heating the silicon wafer, there may be taken: a step of providing the cleaning liquid B to the recessed portions and then removing the cleaning liquid B by drying; or a step of retaining the water-based cleaning liquid comprised of the water-based solution in the recessed portions after providing the cleaning liquid B, followed by removing the water-based cleaning liquid by drying.

In a first cleaning agent, the water-repellent cleaning liquid is a liquid comprising a water-repellent compound having a reactive moiety which can chemically bind with Si element in the silicon wafer and a hydrophobic group, or a liquid in which the water-repellent compound of not less than 0.1 mass % relative to the total quantity of 100 mass % of the water-repellent cleaning liquid and an organic solvent are mixed and contained. Incidentally, a larger content of the water-repellent compound tends to make it difficult to bring the surfaces of the recessed portions into a surface condition of homogeneous water repellency, while a smaller content thereof tends to make it difficult to bring the surfaces of the recessed portions into a surface condition of sufficient water repellency in a short time. Therefore, the water-repellent compound is preferably 0.2-50 mass % and particularly preferably 0.2-30 mass % relative to the total quantity of 100 mass % of the water-repellent cleaning liquid.

In a second cleaning agent, the water-repellent cleaning liquid is a liquid in which the water-repellent compound of 0.1-50 mass % relative to the total quantity of 100 mass % of the water-repellent cleaning liquid and an organic solvent is mixed and contained. Incidentally, a larger content of the water-repellent compound tends to make it difficult to bring the surfaces of the recessed portions into a surface condition of a homogeneous water repellency, while a smaller content thereof tends to make it difficult to bring the surfaces of the recessed portions into a surface condition of sufficient water repellency in a short time. Therefore, the water-repellent compound is preferably 0.1-50 mass % and particularly preferably 0.2-30 mass % relative to the total quantity of 100 mass % of the water-repellent cleaning liquid.

In the second cleaning agent, the organic solvent contains a nitrogen containing solvent whose element to be bonded to nitrogen is carbon. With the nitrogen containing solvent, a reaction between the water-repellent compound and Si element in the silicon wafer is accelerated so as to tend to readily bring the surfaces of the recessed portions of the silicon wafer into the surface condition of sufficient water repellency in a short time. Additionally, it is preferable that the nitrogen containing solvent is at least one selected from the group consisting of tertiary amide, tertiary amine, 1-alkyl-2-pyrrolidone and compounds having pyridine ring.

Concrete examples of the nitrogen containing solvent are N,N-dimethylformamide, N,N-dimethylacetamide, triethylamine, tripropylamine, N-methyl-2-pyrrolidone, pyridine, pyrazine, picoline and the like. In particular, N,N-dimethylformamide and N-methyl-2-pyrrolidone are preferable because these are hard to form an insoluble solid when mixed with the water-repellent compound.

The nitrogen containing solvent is preferably not less than 0.0005 mass %, more preferably not less than 0.001 mass %, much more preferably not less than 0.005 mass % relative to the total quantity of 100 mass % of the water-repellent cleaning liquid. The nitrogen containing solvent of not less than 0.0005 mass % can readily bring the surfaces of the recessed portions of the silicon wafer into the surface condition of sufficient water repellency in a short time.

In the pattern forming step of making the surface of the silicon wafer a surface having a finely uneven pattern, a resist is applied to the surface of the wafer first of all. Thereafter, the resist is exposed through a resist mask, followed by conducting an etching removal on an exposed resist or a unexposed resist, thereby producing a resist having a desired uneven pattern. Additionally, the resist having the uneven pattern can be obtained also by pushing a mold having a pattern onto a resist. Then, etching is conducted on the wafer. At this time, recessed portions of a resist pattern are etched selectively. Finally, the resist is stripped off thereby obtaining a silicon wafer having a finely uneven pattern.

Incidentally, the silicon wafer includes those on which surface a silicon oxide film such as native oxide film, a thermal oxide film, a gas-phase synthesized film (a CVD film, etc.) and the like is formed or those in which at least a part of its uneven pattern is to be silicon oxide when forming the uneven pattern.

Additionally, also against a wafer comprised of two or more components including silicon and/or silicon oxide, it is possible to provide its surface of silicon and/or silicon oxide with water repellency. The wafer comprised of two or more components includes those on which surface a film of silicon and/or silicon oxide such as a native oxide film, a thermal oxide film, a gas-phase synthesized film (a CVD film, etc.) and the like is formed or those in which at least a part of its uneven pattern is to be silicon and/or silicon oxide when forming the uneven pattern.

Figure 2:
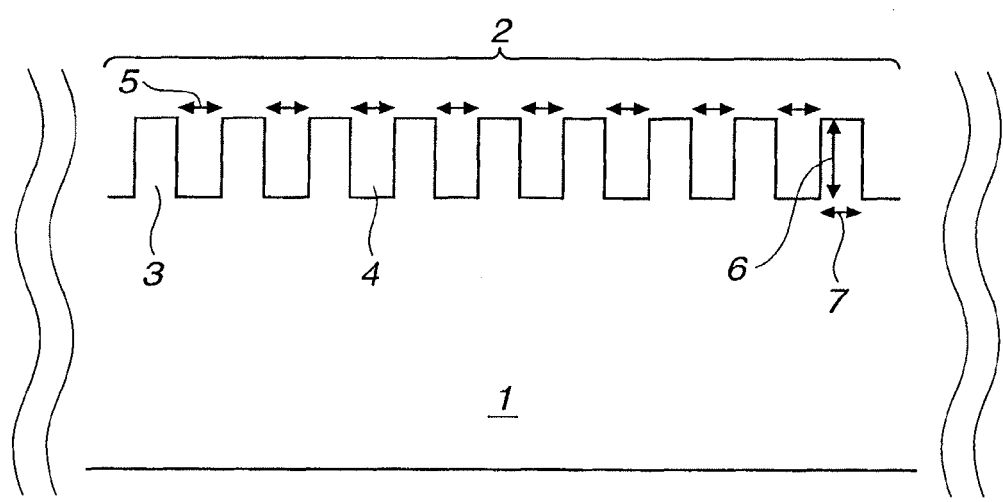
FIG. 2 A view showing a part of a-a' cross section of FIG. 1.

After making the surface of the silicon wafer a surface having a finely uneven pattern, cleaning of the surface is conducted in the use of the water-repellent cleaning liquid, followed by removing the water-repellent cleaning liquid by drying or the like. However, if the recessed portions have a small width and projected portions have a large aspect ratio, a pattern collapse is to be easily induced. The uneven pattern is defined as shown in FIG. 1 and FIG. 2. FIG. 1 is a schematic plan view of a silicon wafer 1 whose surface is made a surface having a finely uneven pattern, while FIG. 2 is a part of an a-a' cross section in FIG. 1. A width 5 of a recessed portion is defined by an interval between a projected portion 3 and a projected portion 3, as shown in FIG. 2. The aspect ratio of the projected portion is expressed by dividing a height 6 of the projected portion by a width 7 of the recessed portion. The pattern collapse in the cleaning process is easily induced when the recessed portion has a width of not more than 70 nm, particularly not more than 45 nm and when the aspect ratio is not less than 4, particularly not less than 6.

In a preferable example of the present invention, the surface of the silicon wafer is made a surface having an uneven pattern, followed by providing the water-based cleaning liquid on the surface and then retaining the water-based cleaning liquid in the recessed portions. Then, the water based cleaning liquid retained in the recessed portions is substituted with the cleaning liquid A different from the water-based cleaning liquid. Preferable examples of the different cleaning liquid A are: the water-repellent cleaning liquid specified by the present invention; water; an organic solvent; a mixture of these; a mixture of these and at least one or more kinds of acid, alkali and surfactant; and the like. Additionally, when using other than the water-repellent cleaning liquid as the different cleaning liquid A, it is preferable to substitute the different cleaning liquid A with the water-repellent cleaning liquid under a condition where the different cleaning liquid A is retained in recessed portions 4.

Additionally, examples of the organic solvent, one of preferable examples of the different cleaning liquid A, are hydrocarbons, esters, ethers, ketones, halogen-containing solvents, sulfoxide-based solvents, alcohols, derivatives of polyhydric alcohol, nitrogen containing solvents, and the like.

Additionally, it is particularly preferable that the organic solvent, one of preferable examples of the different cleaning liquid A, is an aprotic solvent since the water-repellent compound is reactive with a protic solvent. Incidentally, the aprotic solvent means both an aprotic polar solvent and an aprotic nonpolar solvent. Examples of such an aprotic solvent include hydrocarbons, esters, ethers, ketones, halogen-containing solvents, sulfoxide-based solvents, derivatives of polyhydric alcohol having no hydroxyl group, and nitrogen containing solvents having no N—H bond. Examples of the hydrocarbons are toluene, benzene, xylene, hexane, heptane, octane and the like. Examples of the esters are ethyl acetate, propyl acetate, butyl acetate, ethyl acetoacetate and the like. Examples of the ethers are diethyl ether, dipropyl ether, dibutyl ether, tetrahydrofuran, dioxane and the like. Examples of the ketones are acetone, acetylacetone, methyl ethyl ketone, methyl propyl ketone, methyl butyl ketone and the like. Examples of the halogen-containing solvent are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec HFE-7100, Novec HFE-7200, Novec 7300, Novec 7600 (any is produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dicloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifuoropropene and the like; perfluoroethers; perfluoropolyethers; and the like. Examples of the sulfoxide-based solvents are dimethyl sulfoxide and the like. Examples of the derivatives of polyhydric alcohol having no hydroxyl group are acetate-based compounds such as diethylene glycol monoethyl ether acetate, ethylene glycol monomethyl ether acetate, ethylene glycol monobutyl ether acetate, propylene glycol monomethyl ether acetate, propylene glycol monoethyl ether acetate and the like. Examples of the nitrogen containing solvents having no N—H bond are N,N-dimethylformamide, N,N-dimethylacetamide, N-methyl-2-pyrrolidone, triethylamine, pyridine and the like.

Figure 3:
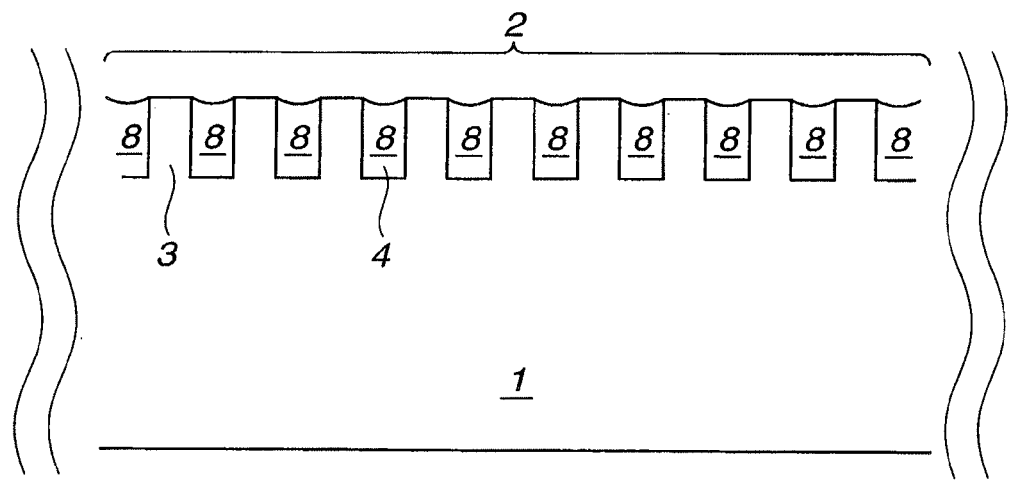
FIG. 3 A schematic view showing a condition where a cleaning liquid 8 is retained in a recessed portion 4 in a cleaning process.

FIG. 3 is a schematic view showing a condition where a cleaning liquid 8 is retained in the recessed portions 4 in the cleaning process. A silicon wafer of the schematic view of FIG. 1 shows a part of the a-a' cross section in FIG. 1. At the time of the cleaning process, the water-repellent cleaning liquid is provided onto a silicon wafer 1 in which an uneven pattern 2 is formed. At this time, the water-repellent cleaning liquid is brought into a condition retained at least in the recessed portions 4 as shown in FIG. 3, thereby imparting water repellency to the recessed portions 4.

In a case of providing the water-based cleaning liquid through the substitution of the water-repellent cleaning liquid under a condition temporarily retained in the recessed portions 4 with a cleaning liquid different from the cleaning liquid, the water-repellent cleaning liquid retained in the recessed portions 4 is substituted with the cleaning liquid B different from the water-repellent cleaning liquid. Examples of the different cleaning liquid B are: water-based cleaning liquids comprised of a water-based solution; an organic solvent; a mixture of the water-based cleaning liquid and the organic solvent; a mixture of these and at least one or more kinds of acid, alkali and surfactant; and the like. Particularly, the water-based cleaning liquid, the organic solvent or the mixture of the water-based cleaning liquid and the organic solvent is preferable. Additionally, when using other than the water-based cleaning liquid as the different cleaning liquid B, it is preferable to substitute the cleaning liquid with the water-based cleaning liquid under a condition where the cleaning liquid other than the water-based cleaning liquid is retained in the recessed portions 4.

Additionally, examples of the organic solvent, one of preferable examples of the different cleaning liquid B, are hydrocarbons, esters, ethers, ketones, halogen-containing solvents, sulfoxide-based solvents, alcohols, derivatives of polyhydric alcohol, nitrogen containing solvents and the like.

Examples of the hydrocarbons are toluene, benzene, xylene, hexane, heptane, octane and the like. Examples of the esters are ethyl acetate, propyl acetate, butyl acetate, ethyl acetoacetate and the like. Examples of the ethers are diethyl ether, dipropyl ether, dibutyl ether, tetrahydrofuran, dioxane and the like. Examples of the ketones are acetone, acetylacetone, methyl ethyl ketone, methyl propyl ketone, methyl butyl ketone and the like. Examples of the halogen-containing solvent are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec HFE-7100, Novec HFE-7200, Novec 7300, Novec 7600 (any is produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dicloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifluoropropene and the like; perfluoroethers; perfluoropolyethers; and the like. Examples of the sulfoxide-based solvents are dimethyl sulfoxide and the like. Examples of the alcohols are methanol, ethanol, propanol, butanol, ethylene glycol, 1,3-propanediol and the like. Examples of the derivatives of polyhydric alcohol are acetate-based compounds such as diethylene glycol monoethyl ether, ethylene glycol monomethyl ether, ethylene glycol monobutyl ether, propylene glycol monomethyl ether, propylene glycol monoethyl ether, diethylene glycol monoethyl ether acetate, ethylene glycol monomethyl ether acetate, ethylene glycol monobutyl ether acetate, propylene glycol monomethyl ether acetate, propylene glycol monoethyl ether acetate and the like. Examples of the nitrogen containing solvents are formamide, N,N-dimethylformamide, N,N-dimethylacetamide, N-methyl-2-pyrrolidone, diethylamine, triethylamine, pyridine and the like.

An example of the water-based cleaning liquid is water, or one containing water with which at least one or more kinds of an organic solvent, acid and alkali is mixed as its main component (for example, a water content of not smaller than 50 mass %). Particularly, the use of water for the water-based cleaning liquid increases a contact angle θ formed between the surface of the recessed portions provided with water repellency by the water-repellent cleaning liquid and the liquid, so as to reduce the capillary force P and further to make stains hard to remain on the surface of the wafer after drying, which is therefore preferable.

Figure 4:
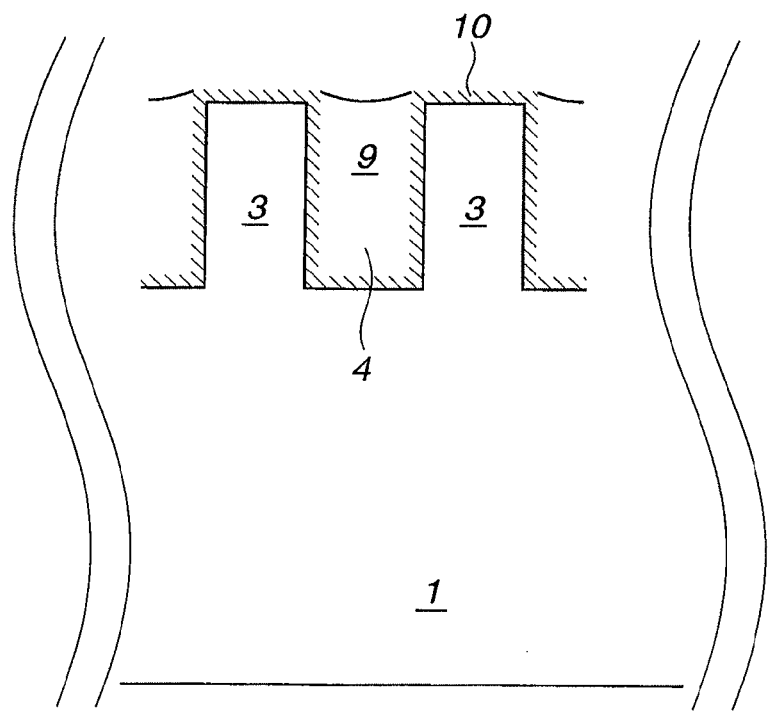
FIG. 4 A schematic view showing a condition where a water-based cleaning liquid is retained in the recessed portion 4 which is under a surface condition provided with water repellency.

A schematic view of a case in which the water-based cleaning liquid is retained in the recessed portions 4 provided with water repellency by the water-repellent compound is shown in FIG. 4. A silicon wafer of the schematic view of FIG. 4 shows a part of the a-a' cross section in FIG. 1. The surfaces of the recessed portions 4 are brought into a surface condition 10 provided with water repellency by the water-repellent compound. Then, with an unit chemically bondable to Si, the surface condition 10 provided with water repellency is kept on the surface of the silicon wafer even when the water-based cleaning liquid 9 is removed from the recessed portions 4.

The capillary force is, on the assumption that the surface of recessed portions formed at the silicon wafer surface provided with water repellency by the water-repellent cleaning liquid, i.e. the recessed portions 4 as shown in FIG. 4 is brought into the surface condition 10 and that water is retained in the recessed portions, preferably not greater than 2.1 MN/m². A capillary force of not greater than 2.1 MN/m² makes the pattern collapse difficult to occur, and therefore is preferable. Additionally, when a smaller the capillary force makes the pattern collapse further difficult to occur, so that the capillary force is particularly preferably not greater than 1.5 MN/m², much more preferably not greater than 1.0 MN/m². Furthermore, it is ideal to put the capillary force to 0.0 MN/m² as close as possible by adjusting the contact angle to the cleaning liquid to be around 90°.

Additionally, in the water-repellent compound of the water-repellent cleaning liquid, having the reactive moiety which can chemically bind with Si element in the silicon wafer and a hydrophobic group, the reactive moiety is exemplified by those who can react with silanol group (Si—OH group).

Examples thereof are: halogen group such as chloro group, bromo group and the like; Si—N bond with isocyanate group, amino group, dialkylamino group, isothiocyanate group, azide group, acetamide group, silazane, —N(CH₃)COCH₃, —N(CH₃)COCF₃, imidazole ring, oxazolidinone ring, morpholine ring or the like; Si—O—C bond with alkoxy group, acetoxy group, trifluoroacetoxy group, —OC(CH₃)=CHCOCH₃, —OC(CH₃)=N—Si(CH₃)₃, —OC(CF₃)=N—Si(CH₃)₃, —CO—NH—Si(CH₃)₃ or the like; Si—O—S bond with alkylsulfonate group, perfluoroalkylsulfonate group or the like; nitrile group; and the like. Additionally, examples of the hydrophobic group are a monovalent organic group having hydrocarbon group and a monovalent organic group having C—F bond. Such a water-repellent compound is to swiftly react at its reactive moiety with silanol group of a silicon oxide layer of the uneven pattern of the silicon wafer so as to be chemically bonded to Si element in the silicon wafer through siloxane bond. With this, it becomes possible to coat the surface of the wafer with hydrophobic groups, thereby allowing reducing the capillary force in a short time.

Furthermore, it is preferable, in the water-repellent cleaning liquid, that the water-repellent compound having the reactive moiety chemically bondable to Si element in the silicon wafer and the hydrophobic group is comprised of at least one selected from the group consisting of the following general formulas [1], [2] and [3].

$$(R^1)_a Si(CH_3)_b H_c X_{4-a-b-c} \qquad [1]$$

$$[R^2 Si(CH_3)_{2-d} H_d]_e NH_{3-e} \qquad [2]$$

$$R^3 Si(CH_3)_2 Y \qquad [3]$$

Now, each of $R^1$, $R^2$ and $R^3$ is a monovalent organic group having hydrocarbon group with a carbon number of 1 to 18 or a monovalent organic group having perfluoroalkyl chain with a carbon number of 1 to 8. X represents chloro group, isocyanate group, alkoxy group, acetoxy group, trifluoroacetoxy group, —OC(CH₃)=CHCOCH₃, alkylsulfonate group, perfluoroalkylsulfonate group, or nitrile group. Y represents a monovalent organic group whose element to be bonded to Si is nitrogen. a is an integer of from 1 to 3 while b and c are integers of from 0 to 2, and the total of a, b and c is from 1 to 3. Furthermore, d is an integer of from 0 to 2 and e is an integer of from 1 to 3.

Additionally, it is particularly preferable that each of $R^1$ of the general formula [1], $R^2$ of the general formula [2], and $R^3$ of the general formula [3] is $C_m H_{2m+1}$ (m=1-18) or $C_n F_{2n+1} CH_2 CH_2$ (n=1-8).

Examples of usable water-repellent compound represented by the general formula [1] are: alkylchlorosilane such as $C_{18}H_{37}SiCl_3$, $C_{10}H_{21}SiCl_3$, $C_6H_{13}SiCl_3$, $C_3H_7SiCl_3$, $CH_3SiCl_3$, $C_{18}H_{37}Si(CH_3)Cl_2$, $C_{10}H_{21}Si(CH_3)Cl_2$, $C_6H_{13}Si(CH_3)Cl_2$, $C_3H_7Si(CH_3)Cl_2$, $(CH_3)_2SiCl_2$, $C_{18}H_{37}Si(CH_3)_2Cl$, $C_{10}H_{21}Si(CH_3)_2Cl$, $C_6H_{13}Si(CH_3)_2Cl$, $C_3H_7Si(CH_3)_2Cl$, $(CH_3)_3SiCl$, $(CH_3)_2SiHCl$ and the like; fluoroalkylchlorosilane such as $C_8F_{17}CH_2CH_2SiCl_3$, $C_6F_{13}CH_2CH_2SiCl_3$, $C_4F_9CH_2CH_2SiCl_3$, $CF_3CH_2CH_2SiCl_3$, $C_8F_{17}CH_2CH_2Si(CH_3)Cl_2$, $C_6F_{13}CH_2CH_2Si(CH_3)Cl_2$, $C_4F_9CH_2CH_2Si(CH_3)Cl_2$, $CF_3CH_2CH_2Si(CH_3)Cl_2$, $C_8F_{17}CH_2CH_2Si(CH_3)_2Cl$, $CF_{13}CH_2CH_2Si(CH_3)_2Cl$, $C_4F_9CH_2CH_2Si(CH_3)_2Cl$, $CF_3CH_2CH_2Si(CH_3)_2Cl$, $CF_3CH_2CH_2Si(CH_3)HCl$ and the like; or a water-repellent compound in which chloro group of the above-mentioned chlorosilane is replaced with isocyanate group, alkoxy group, acetoxy group, trifluoroacetoxy group, —OC(CH₃)=CHCOCH₃, alkylsulfonate group, perfluoroalkylsulfonate group, or nitrile group. The particularly preferable are chloro group, isocyanate group and alkoxy group.

Examples of usable water-repellent compound represented by the general formula [2] are $(CH_3)_3SiNHSi(CH_3)_3$, $C_2H_5Si(CH_3)_2NHSi(CH_3)_2C_2H_5$, $C_3H_7Si(CH_3)_2NHSi(CH_3)_2C_3H_7$, $C_6H_{13}Si(CH_3)_2NHSi(CH_3)_2C_6H_{13}$, $C_6H_5Si(CH_3)_2NHSi(CH_3)_2C_6H$, $\{(CH_3)_3Si\}_3N$, $\{C_2H_5Si(CH_3)_2\}_3N$, $(CH_3)_2HSiNHSi(CH_3)_2H$, $CF_3CH_2CH_2Si(CH_3)_2NHSi(CH_3)_2CH_2CH_2CF_3$, $C_4F_9CH_2CH_2Si(CH_3)_2NHSi(CH_3)_2CH_2CH_2C_4F_9$, $C_6F_{13}CH_2CH_2Si(CH_3)_2NHSi(CH_3)_2CH_2CH_2C_6F_{13}$, $C_8F_{17}CH_2CH_2Si(CH_3)NHSi(CH_3)_2CH_2CH_2CH-F_{17}$, $\{CF_3CH_2CH_2Si(CH_3)_2\}_3N$, and the like. Particularly, disilazane where d in the general formula [2] is 0 is preferable.

Furthermore, examples of usable water-repellent compound represented by the general formula [3] are compounds where Y is $-NH_2$, $N(CH_3)_2$, $-N(C_2H_5)_2$, $-NHCOCH_3$, $-N_3$, $-N=C=S$, $-N(CH_3)COCH_3$, $-N(CH_3)COCF_3$, $-N=C(CH_3)OSi(CH_3)_3$, $-N=C(CF_3)OSi(CH_3)_3$, $-NHCO-OSi(CH_3)_3$, $-NHCO-NH-Si(CH_3)_3$, imidazole ring, oxazolidinone ring, morpholine ring or the like.

Additionally, if water is present in the water-repellent cleaning liquid, the reactive moiety of the water-repellent compound is hydrolyzed to be silanol group (Si—OH). The reactive moiety is reactive with this silanol group. As a result, water-repellent compounds are bonded to each other to be a dimer. The dimer is low in reactivity with silanol group in the silicon oxide layer of the silicon wafer, so that the time required to provide the surface of the silicon wafer with water repellency is increased. As the solvent for the water-repellent cleaning liquid, therefore, other than water, i.e. the organic solvent is used. The organic solvent is acceptable if able to dissolve the water-repellent compound therein; and preferably usable examples thereof are hydrocarbons, esters, ethers, ketones, halogen-containing solvents, sulfoxide-based solvents, alcohols, derivatives of polyhydric alcohol, nitrogen containing solvents, and the like.

However, using the aprotic solvent as the organic solvent since the water-repellent compound is reactive with the protic solvent is particularly preferable because water repellency becomes readily exhibited in a short time. Incidentally, the aprotic solvent means both an aprotic polar solvent and an aprotic nonpolar solvent. Examples of such an aprotic solvent include hydrocarbons, esters, ethers, ketones, halogen-containing solvents, sulfoxide-based solvents, derivatives of polyhydric alcohol having no hydroxyl group, and nitrogen containing solvents having no N—H bond. Examples of the hydrocarbons are toluene, benzene, xylene, hexane, heptane, octane and the like. Examples of the esters are ethyl acetate, propyl acetate, butyl acetate, ethyl acetoacetate and the like. Examples of the ethers are diethyl ether, dipropyl ether, dibutyl ether, tetrahydrofuran, dioxane and the like. Examples of the ketones are acetone, acetylacetone, methyl ethyl ketone, methyl propyl ketone, methyl butyl ketone and the like. Examples of the halogen-containing solvent are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec HFE-7100, Novec HFE-7200, Novec 7300, Novec 7600 (any is produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dicloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifluoropropene and the like; perfluoroethers; perfluoropolyethers; and the like. Examples of the sulfoxide-based solvents are dimethyl sulfoxide and the like. Examples of the derivatives of polyhydric alcohol having no hydroxyl group are acetate-based compounds such as diethylene glycol monoethyl ether acetate, ethylene glycol monomethyl ether acetate, ethylene glycol monobutyl ether acetate, propylene glycol monomethyl ether acetate, propylene glycol monoethyl ether acetate and the like. Examples of the nitrogen containing solvents having no N—H bond are N,N-dimethylformamide, N,N-dimethylacetamide, N-methyl-2-pyrrolidone, triethylamine, pyridine and the like.

Additionally, it is preferable to use a uninflammable one as the organic solvent since the water-repellent cleaning liquid becomes uninflammable or becomes high in flash point to reduce the risk of the water-repellent cleaning liquid. The halogen-containing solvent is large in number of the uninflammable one. Such a halogen-containing uninflammable solvent can be preferably used as a uninflammable organic solvent.

Additionally, a very small quantity of water may be present in the organic solvent. However, when the water is contained in the solvent in large quantity, the water-repellent compound is hydrolyzed by the water so as to be sometimes reduced in reactivity. It is, therefore, preferable to set the water content in the solvent low. The water content at the time of being mixed with the water-repellent compound is preferably less than 1 mole, particularly preferably less than 0.5 mole relative to the water-repellent compound in mole ratio.

Additionally, a catalyst may be added to the water-repellent cleaning liquid in order to accelerate the reaction between the water-repellent compound and the wafer surface. The preferably used as such a catalyst are: acids containing no water such as trifluoroacetic acid, trifluoroacetic anhydride, pentafluoropropionic acid, pentafluoropropionic anhydride, trifluoromethanesulfonic acid, trifluoromethanesulfonic anhydride, sulfuric acid, hydrogen chloride and the like; bases such as ammonia, alkylamine, dialkylamine and the like; nitrogen-containing aprotic solvents pyridine, dimethylformamide and the like; salts such as ammonium sulfide, potassium acetate, methylhydroxyamine hydrochloride; and a metallic complex or a metallic salt of tin, aluminum, titanium or the like. Particularly, if taking a catalytic effect and cleanliness into account, the preferable are acids containing no water, such as trifluoroacetic acid, trifluoroacetic anhydride, trifluoromethanesulfonic acid, trifluoromethanesulfonic anhydride, sulfuric acid, hydrogen chloride and the like.

The added amount of the catalyst is preferably from 0.001 to 5 mass % relative to the total quantity of 100 mass % of the water-repellent (second) cleaning liquid. The catalytic effect is reduced when the added amount is small, so that it is not preferable. Additionally, excessively increased catalyst can cause a fear of eroding the wafer surface or remaining as impurity on the wafer, rather than improves the catalytic effect. The added amount of the catalyst is, therefore, preferably from 0.001 to 5 mass %.

Moreover, if the temperature is increased, the water-repellent cleaning liquid becomes liable to bring about a surface condition where the surfaces of the recessed portions are provided with water repellency, in a short time. The temperature liable to bring about a surface condition homogeneously provided with water repellency is preferably kept at 10 to 160° C., particularly at 15 to 120° C. It is preferable to keep the temperature of the water-repellent cleaning liquid at the temperature also when the water-repellent cleaning liquid is retained in the recessed portions 4.

Then, a step of removing the cleaning liquid retained in the recessed portions 4 provided with water repellency by the water-repellent compound, followed by removing the cleaning agent, is conducted. This step preferably includes:

a step of removing the cleaning liquid retained in the recessed portions from the recessed portions by drying; and a step of irradiating the surface of the silicon wafer with light or heating the silicon wafer.

At the time of removing the cleaning liquid from the recessed portions, the cleaning liquid retained in the recessed portions is preferably the water-based cleaning liquid. In this case, it is preferable to conduct a step of retaining the water-based cleaning liquid comprised of the water-based solution in the recessed portions after the step of retaining the water-repellent cleaning liquid in the recessed portions, through the substitution of the water-repellent cleaning liquid retained in the recessed portions with the cleaning liquid B different from the water-repellent cleaning liquid. Incidentally, when the cleaning liquid is removed from the recessed portions, the cleaning liquid retained in the recessed portions may be the water-repellent cleaning liquid or the different cleaning liquid B.

In the step of removing the cleaning liquid from the recessed portions, the cleaning liquid is removed by drying. The drying is preferably conducted by a conventional drying method such as spin drying, IPA (2-propanol) steam drying, Marangoni drying, heating drying, warm air drying, vacuum drying and the like.

In the step of irradiating the surface of the silicon wafer with light or heating the silicon wafer, the surface condition 10 where the surface of the silicon wafer is provided with water repellency is removed.

In the case where the surface condition 10 provided with water repellency is removed by light irradiation, it is effective to cleave Si—C bond, C—C bond and C—F bond in the surface condition 10 provided with water repellency by the water-repellent compound. In order to achieve this, it is preferable to conduct an irradiation with ultraviolet rays having wavelengths of 350-450 nm, 340 nm and shorter than 240 nm (corresponding to bond energies of them, i.e., 58-80 kcal/mol, 83 kcal/mol and 116 kcal/mol). As the light source therefor, there is used a metal halide lamp, a low-pressure mercury light, a high-pressure mercury light, an excimer lamp, a carbon arc or the like. The intensity of the ultraviolet irradiation is preferably not less than 100 mW/cm$^2$, particularly preferably not less than 200 mW/cm$^2$, for example, as a measurement value by the illuminance meter (Ultraviolet intensity meter UM-10 produced by Konica Minolta, Light-Receptor UM-360 [Peak sensitivity wavelength: 365 nm, measured wavelength range: 310 to 400 nm]). Incidentally, an irradiation intensity less than 100 mW/cm$^2$ takes a long time to remove the surface condition 10 provided with water repellency.

Additionally, in the case of removing the surface condition 10 provided with water repellency by light irradiation, it is particularly preferable to generate active oxygen in parallel with decomposing components of the surface condition 10 provided with water repellency by ultraviolet rays and then to induce oxidation-volatilization of the components of the surface condition 10 provided with water repellency by the active oxygen, since a treating time is to be saved thereby. As the light source therefor, the low-pressure mercury light or the excimer lamp is used.

In the case of heating the silicon wafer, heating of the silicon wafer is conducted at 400 to 700° C., preferably at 500 to 700° C. It is preferable to keep the heating time from 1 to 60 min, preferably from 10 to 30 min. Additionally, this step may be conducted in combination with ozone exposure, plasma irradiation, corona discharge or the like.

EXAMPLES

To make a silicon wafer have a surface with a finely uneven pattern and to substitute a cleaning liquid retained in recessed portions with another cleaning liquid are already-established techniques, as discussed in conventionally known literatures and the like. In the present invention, therefore, evaluations of water-repellent cleaning liquid were mainly performed. Additionally, a pattern collapse greatly depends on the contact angle of the cleaning liquid to the surface of the silicon wafer or the contact angle of liquid drop, and the surface tension of the cleaning liquid, as clearly represented by the equation discussed as the background of the technique $$P=2\times\gamma\times\cos\theta/S \text{ ($\gamma$: Surface tension, $\theta$: Contact angle, $S$: Pattern width).}$$

In a case of a cleaning liquid retained in the recessed portions 4 of the uneven pattern 2, the contact angle of liquid drop and the capillary force which is considerable as an equivalent of the pattern collapse are in correlation with each other, so that the capillary force may be derived from the equation and the evaluation of the contact angle of liquid drop on the surface condition 10 provided with water repellency. Incidentally, in Examples, a representative of a water-based cleaning agent was used, i.e., water.

However, in a case where the silicon wafer has a finely uneven pattern at its surface, the pattern is significantly fine. Therefore it is not possible to exactly evaluate the water repellency of the water repellency-provided surface condition 10 itself.

Evaluation of the contact angle of waterdrop for evaluating the water repellency is conducted by dropping several microliters of waterdrop on a surface of a sample (substrate) and then by measuring an angle formed between the waterdrop and the substrate surface, as discussed in JIS R 3257 (Testing method of wettability of glass substrate surface). However, in the case of the silicon wafer having a pattern, the contact angle is enormously large. This is because Wenzel's effect or Cassie's effect is caused. That is because an apparent contact angle of the waterdrop is increased under the influence of a surface shape (roughness) of the substrate upon the contact angle.

In view of this, in the present invention, various evaluations are performed by providing the water-repellent cleaning liquid to an even silicon wafer so as to bring about a surface condition provided with water-repellency and then regarding the surface condition as a water repellency-provided surface condition 10 of the silicon wafer at which surface an uneven pattern 2 is formed.

Details will be discussed below. Hereinafter, there will be discussed an evaluation method for the silicon wafer provided with the water-repellent cleaning liquid, the preparation of the water-repellent cleaning liquid, and results of evaluations after providing the water-repellent cleaning liquid to the silicon wafer.

[Evaluation Method for Silicon Wafer to which Water-Repellent Cleaning Liquid is Provided]

As an evaluation method for the silicon wafer provided with the water-repellent cleaning liquid, the following evaluations (1) to (4) were performed.

(1) Evaluation of Contact Angle of Surface Condition Provided with Water Repellency by Water-Repellent Cleaning Liquid Pure water of about 2 microliters was dropped on a wafer surface provided with water repellency, followed by measuring an angle (contact angle) formed between the waterdrop and the wafer surface by a contact angle meter (produced by Kyowa Interface Science Co., Ltd.: CA-X Model). At this time, a water repellency-provided surface condition having a contact angle within a range of from 50 to 120° was determined as an acceptable one (indicated in Tables with A).

(2) Evaluation of the Capillary Force

The capillary force (the absolute value of P) was obtained by calculating P by using the following equation.

$$P = 2 \times \gamma \times \cos\theta / S$$

where γ is a surface tension, θ is a contact angle, and S is a pattern width. Incidentally, in a pattern having a line width of 45 nm and an aspect ratio of 6, the pattern tends to collapse in a case where the cleaning liquid used when the wafer passes through an gas-liquid interface is water while difficult to collapse in a case of 2-propanol. In a case where the pattern width is 45 nm and the wafer surface is silicon oxide, when the cleaning liquid is 2-propanol (Surface tension: 22 mN/m, Contact angle to silicon oxide:1°), the capillary force is 0.98 MN/m². On the other hand, in a case of water having the largest surface tension among liquids other than mercury (Surface tension: 72 mN/m, Contact angle to silicon oxide:2.5), the capillary force is 3.2 MN/m². Therefore, the objective was set to the midpoint, 2.1 MN/m². A capillary force of not greater than 2.1 MN/m², at the time of retaining water, was determined as an acceptable one (indicated in Tables with A).

(3) Removability for Surface Condition Provided with Water Repellency by Water-Repellent Cleaning Liquid Under the following conditions, the sample was irradiated with UV rays from a metal halide lamp for 2 hours. Those having a contact angle to waterdrop of not larger than 30° after the irradiation was determined as an acceptable one (indicated in Tables with A).

Lamp: M015-L312 produced by EYE GRAPHICS CO., LTD. (Intensity: 1.5 kW)
Illuminance: 128 mW/cm² as a measurement value under the following conditions
Measuring Apparatus: Ultraviolet Intensity Meter (UM-10 produced by Konica Minolta)
Light-Receptor: UM-360
  (Light-Receptive Wavelength: 310 to 400 nm, Peak Wavelength: 365 nm)
Measuring Mode: Irradiance Measurement (4) Evaluation of Roughness of Silicon Wafer Surface after Removing Water Repellency-Provided Surface Condition The surface was observed by atomic force microscope (produced by Seiko Instruments Inc.: SPI3700, 2.5 micrometer square scan), thereby obtaining the centerline average surface roughness: Ra (nm). Incidentally, Ra is one which is three-dimensionally enlarged by applying the centerline average roughness defined by JIS B 0601 to a measured surface and is calculated as "an average value of absolute values of difference from standard surface to designated surface" from the following equation. If the wafer has an Ra value of not higher than 1 nm after removing the water repellency-provided surface condition, the wafer surface was considered not to be eroded and not to have a residue of the water-repellent cleaning liquid thereon, so as to be determined as an acceptable one (indicated in Tables with A).

$$Ra = \frac{1}{S_0} \int_{Y_T}^{Y_B} \int_{X_L}^{X_R} |F(X, Y) - Z_0| dX dY \qquad \text{[Mathematical Equation 1]}$$

where XL and XR and YB and YT represent a measuring range in the X coordinate and the Y coordinate, respectively. $S_0$ is an area on the assumption that a measured surface is ideally flat, and is a value obtained by $(X_R - X_L) \times (Y_B - Y_T)$. Additionally, F(X,Y) represents a height at a measured point (X,Y) while $Z_0$ represents an average height within the measured surface.

The following Examples 1 to 44 exemplifies a first cleaning agent while the following Comparative Examples 1 and 2 are opposed to the first cleaning agent. Results of these are shown in Table 1 and Table 2.

Example 1

(1) Preparation of Water-Repellent Cleaning Liquid

A mixture of 3 g of trimethylchlorosilane [$(CH_3)_3SiCl$] serving as a water-repellent compound and 97 g of toluene serving as an organic solvent was stirred for 5 min thereby obtaining a water-repellent cleaning liquid having a concentration of the water-repellent compound (hereinafter referred to as "a water-repellent compound concentration") of 3 mass % relative to the total quantity of the water-repellent cleaning liquid.

(2) Cleaning of Silicon Wafer

An even silicon wafer with a thermal oxide film (A Si wafer having on its surface a thermal oxide film layer of 1 micrometer thickness) was immersed in 1 mass % hydrofluoric acid aqueous solution for 2 min, followed by being immersed in pure water for 1 min and then in acetone for 1 min.

(3) Surface Treatment of Silicon Wafer Surface by Water-Repellent Cleaning Liquid The water-repellent cleaning liquid prepared in the "(1) Preparation of Water-Repellent Cleaning Liquid" was heated to 50° C., followed by immersion in the cleaning liquid for 30 min. Thereafter, the silicon wafer was immersed in 2-propanol for 1 min and then immersed in pure water for 1 min. Finally, the silicon wafer was taken out of the pure water and then an air was sprayed thereon, thereby removing the pure water from the surface.

As a result of evaluating the obtained wafer in a manner as discussed in the [Evaluation Method For Silicon Wafer To Which Water-Repellent Cleaning Liquid Is Provided], one having had an initial contact angle of smaller than 10° before a surface treatment changed to have a contact angle of 74° after the surface treatment, as shown in Table 1, thereby exhibiting a water repellency-providing effect. Additionally, as a result of calculating the capillary force at the time where water was retained by using the equation discussed in the above-mentioned "Evaluation of the capillary force", the capillary force was 0.9 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

TABLE 1

| | Water-repellent cleaning liquid | | | Treatment of water-repellent cleaning liquid before surface treatment | Immersion | |
|---|---|---|---|---|---|---|
| | Water-repellent compound | Organic solvent | Water-repellent compound concentration [mass %] | Solvent used for cleaning after rinsing with water | Temperature [° C.] | Time [min] |
| Example 1 | $(CH_3)_3SiCl$ | Toluene | 3 | Acetone | 50 | 30 |
| Example 2 | $(CH_3)_3SiCl$ | Toluene | 1 | Acetone | 50 | 30 |
| Example 3 | $(CH_3)_3SiNHSi(CH_3)_3$ | Toluene | 3 | Acetone | 50 | 30 |
| Example 4 | $CF_3CH_2CH_2SiCl_3$ | Toluene | 3 | Acetone | 50 | 30 |
| Example 5 | $CF_3CH_2CH_2Si(CH_3)Cl_2$ | Toluene | 3 | Acetone | 50 | 30 |
| Example 6 | $CF_3CH_2CH_2Si(CH_3)_2Cl$ | Toluene | 3 | Acetone | 50 | 30 |
| Example 7 | $C_{18}H_{37}Si(CH_3)_2Cl$ | Toluene | 3 | Acetone | 50 | 30 |
| Example 8 | $(CH_3)_3SiCl + CF_3CH_2CH_2Si(CH_3)_2Cl$ | Toluene | 3 | Acetone | 50 | 30 |
| Example 9 | $(CH_3)_3SiCl$ | HFE-7100 | 3 | Acetone | 50 | 30 |
| Example 10 | $(CH_3)_3SiCl$ | ZEORORA-H | 3 | Acetone | 50 | 30 |
| Example 11 | $(CH_3)_3SiCl$ | DCTFP | 3 | Acetone | 50 | 30 |
| Example 12 | $(CH_3)_3SiCl$ | CTFP | 3 | Acetone | 50 | 30 |
| Example 13 | $(CH_3)_3SiCl$ | HFE-7100 | 3 | Acetone | 50 | 30 |
| Example 14 | $(CH_3)_3SiCl$ | DCTFP | 3 | Acetone | 50 | 30 |
| Example 15 | $(CH_3)_3SiCl$ | HFE-7100 | 3 | Acetone | 50 | 30 |
| Example 16 | $(CH_3)_3SiCl$ | DCTFP | 3 | Acetone | 50 | 30 |
| Example 17 | $(CH_3)_3SiCl$ | DCTFP | 3 | Acetone | 50 | 30 |
| Example 18 | $(CH_3)_3SiCl$ | DCTFP | 3 | Acetone | 50 | 30 |
| Example 19 | $(CH_3)_3SiCl$ | DCTFP | 3 | Acetone | 50 | 30 |
| Example 20 | $(CH_3)_3SiCl$ | HFE-7100 | 3 | Acetone | 50 | 30 |
| Example 21 | $(CH_3)_3SiCl$ | DCTFP | 3 | Acetone | 50 | 30 |
| Example 22 | $(CH_3)_3SiCl$ | Toluene | 3 | iPA | 50 | 30 |
| Example 23 | $(CH_3)_3SiCl$ | HFE-7100 | 3 | iPA | 50 | 30 |
| Example 24 | $(CH_3)_3SiCl$ | DCTFP | 3 | iPA | 50 | 30 |
| Example 25 | $(CH_3)_3SiCl$ | PGMEA | 3 | iPA | 50 | 30 |
| Example 26 | $(CH_3)_3SiCl$ | HFE-7100 + PGMEA | 3 | iPA | 50 | 30 |
| Example 27 | $(CH_3)_3SiCl$ | HFE-7100 | 3 | iPA | 50 | 30 |
| Example 28 | $(CH_3)_3SiCl$ | DCTFP | 3 | iPA | 50 | 30 |
| Example 29 | $(CH_3)_3SiCl$ | HFE-7100 | 3 | iPA | 50 | 30 |
| Example 30 | $(CH_3)_3SiCl$ | DCTFP | 3 | iPA | 50 | 30 |

| | Treatment of water-repellent cleaning liquid after surface treatment | | | | Evaluation results | | | | |
|---|---|---|---|---|---|---|---|---|---|
| | Drying | Cleaning with solvent | Cleaning with water | Drying | Initial contact angle [°] | Contact angle after surface treatment [°] | Capillary force [MN/m²] <calculated value> | Removability of water-repellent surface condition (contact angle [°]) | Surface roughness (Ra [nm]) |
| Example 1 | Not done | Done | Done | Done | <10 | A (74) | A (0.9) | A (<10) | A (<0.5) |
| Example 2 | Not done | Done | Done | Done | <10 | A (68) | A (1.2) | A (<10) | A (<0.5) |
| Example 3 | Not done | Done | Done | Done | <10 | A (55) | A (1.8) | A (<10) | A (<0.5) |
| Example 4 | Not done | Done | Done | Done | <10 | A (86) | A (0.2) | A (<10) | A (<0.5) |
| Example 5 | Not done | Done | Done | Done | <10 | A (84) | A (0.3) | A (<10) | A (<0.5) |
| Example 6 | Not done | Done | Done | Done | <10 | A (70) | A (1.1) | A (<10) | A (<0.5) |
| Example 7 | Not done | Done | Done | Done | <10 | A (88) | A (0.1) | A (<10) | A (<0.5) |
| Example 8 | Not done | Done | Done | Done | <10 | A (76) | A (0.8) | A (<10) | A (<0.5) |
| Example 9 | Not done | Done | Done | Done | <10 | A (74) | A (0.9) | A (<10) | A (<0.5) |
| Example 10 | Not done | Done | Done | Done | <10 | A (78) | A (0.7) | A (<10) | A (<0.5) |
| Example 11 | Not done | Done | Done | Done | <10 | A (72) | A (1.0) | A (<10) | A (<0.5) |
| Example 12 | Not done | Done | Done | Done | <10 | A (74) | A (0.9) | A (<10) | A (<0.5) |
| Example 13 | Not done | Done | Not done | Done | <10 | A (72) | A (1.0) | A (<10) | A (<0.5) |
| Example 14 | Not done | Done | Not done | Done | <10 | A (70) | A (1.1) | A (<10) | A (<0.5) |
| Example 15 | Not done | Not done | Done | Done | <10 | A (74) | A (0.9) | A (<10) | A (<0.5) |
| Example 16 | Not done | Not done | Done | Done | <10 | A (72) | A (1.0) | A (<10) | A (<0.5) |
| Example 17 | Done | Done | Done | Done | <10 | A (72) | A (1.0) | A (<10) | A (<0.5) |
| Example 18 | Done | Done | Not done | Done | <10 | A (70) | A (1.1) | A (<10) | A (<0.5) |
| Example 19 | Done | Not done | Done | Done | <10 | A (72) | A (1.0) | A (<10) | A (<0.5) |

TABLE 1-continued

| | | | | | | | | | |
|---|---|---|---|---|---|---|---|---|---|
| Example 20 | Done | Not done | Not done | Not done | <10 | A (74) | A (0.9) | A (<10) | A (<0.5) |
| Example 21 | Done | Not done | Not done | Not done | <10 | A (72) | A (1.0) | A (<10) | A (<0.5) |
| Example 22 | Not done | Done | Done | Done | <10 | A (72) | A (1.0) | A (<10) | A (<0.5) |
| Example 23 | Not done | Done | Done | Done | <10 | A (72) | A (1.0) | A (<10) | A (<0.5) |
| Example 24 | Not done | Done | Done | Done | <10 | A (70) | A (1.1) | A (<10) | A (<0.5) |
| Example 25 | Not done | Done | Done | Done | <10 | A (66) | A (1.3) | A (<10) | A (<0.5) |
| Example 26 | Not done | Done | Done | Done | <10 | A (76) | A (0.8) | A (<10) | A (<0.5) |
| Example 27 | Not done | Done | Not done | Done | <10 | A (70) | A (1.1) | A (<10) | A (<0.5) |
| Example 28 | Not done | Done | Not done | Done | <10 | A (70) | A (1.1) | A (<10) | A (<0.5) |
| Example 29 | Done | Not done | Not done | Not done | <10 | A (72) | A (1.0) | A (<10) | A (<0.5) |
| Example 30 | Done | Not done | Not done | Not done | <10 | A (72) | A (1.0) | A (<10) | A (<0.5) |

TABLE 2

| | Water-repellent cleaning liquid | | | Treatment of water-repellent | | |
|---|---|---|---|---|---|---|
| | Water-repellent compound | Organic solvent | Water-repellent compound concentration [mass %] | cleaning liquid before surface treatment Solvent used for cleaning after rinsing with water | Immersion Temperature [° C.] | Time [min] |
| Example 31 | $(CH_3)_3SiCl$ | Toluene | 3 | iPA, Toluene | 50 | 30 |
| Example 32 | $(CH_3)_3SiCl$ | HFE-7100 | 3 | iPA, HFE-7100 | 50 | 30 |
| Example 33 | $(CH_3)_3SiCl$ | Toluene | 3 | None | 50 | 30 |
| Example 34 | $(CH_3)_3SiCl$ | HFE-7100 | 3 | None | 50 | 30 |
| Example 35 | $C_2H_5Si(CH_3)_2Cl$ | HFE-7100 | 3 | iPA | 50 | 30 |
| Example 36 | $C_3H_7Si(CH_3)_2Cl$ | HFE-7100 | 3 | iPA | 50 | 30 |
| Example 37 | $(CH_3)_3SiNHSi(CH_3)_3$ | Toluene | 5 | Acetone | 50 | 30 |
| Example 38 | $(CH_3)_3SiNHSi(CH_3)_3$ | Toluene | 5 | Acetone | 50 | 30 |
| Example 39 | $(CH_3)_3SiNHSi(CH_3)_3$ | HFE-7100 + PGMEA | 5 | iPA | 50 | 30 |
| Example 40 | $(CH_3)_3SiNHSi(CH_3)_3$ | HFE-7100 + PGMEA | 5 | iPA | 50 | 30 |
| Example 41 | $(CH_3)_3SiNHSi(CH_3)_3$ | PGMEA | 5 | iPA | 50 | 30 |
| Example 42 | $(CH_3)_3SiNHSi(CH_3)_3$ | PGMEA | 5 | iPA | 50 | 30 |
| Example 43 | $(CH_3)_3SiNHSi(CH_3)_3$ | PGMEA | 5 | iPA | 50 | 30 |
| Example 44 | $(CH_3)_3SiNHSi(CH_3)_3$ | PGMEA | 5 | iPA | 50 | 30 |
| Comparative Example 1 | Not treated | — | — | Acetone | — | — |
| Comparative Example 2 | Hydrolysate of $(CH_3)_3SiCl$ | iPA | 3 | Acetone | 50 | 30 |

| | Treatment of water-repellent cleaning liquid after surface treatment | | | | Evaluation results | | | | |
|---|---|---|---|---|---|---|---|---|---|
| | Drying | Cleaning with solvent | Cleaning with water | Drying | Initial contact angle [°] | Contact angle after surface treatment [°] | Capillary force [MN/m²] <calculated value> | Removability of water-repellent surface condition (contact angle [°]) | Surface roughness (Ra [nm]) |
| Example 31 | Not done | Done | Done | Done | <10 | A (74) | A (0.9) | A (<10) | A (<0.5) |
| Example 32 | Not done | Done | Done | Done | <10 | A (74) | A (0.9) | A (<10) | A (<0.5) |
| Example 33 | Not done | Done | Done | Done | <10 | A (70) | A (1.1) | A (<10) | A (<0.5) |
| Example 34 | Not done | Done | Done | Done | <10 | A (70) | A (1.1) | A (<10) | A (<0.5) |
| Example 35 | Not done | Done | Done | Done | <10 | A (76) | A (0.8) | A (<10) | A (<0.5) |
| Example 36 | Not done | Done | Done | Done | <10 | A (80) | A (0.6) | A (<10) | A (<0.5) |
| Example 37 | Not done | Done | Done | Done | <10 | A (86) | A (0.2) | A (<10) | A (<0.5) |
| Example 38 | Not done | Done | Done | Done | <10 | A (86) | A (0.2) | A (<10) | A (<0.5) |
| Example 39 | Not done | Done | Done | Done | <10 | A (86) | A (0.2) | A (<10) | A (<0.5) |
| Example 40 | Not done | Done | Done | Done | <10 | A (86) | A (0.2) | A (<10) | A (<0.5) |
| Example 41 | Not done | Done | Done | Done | <10 | A (84) | A (0.3) | A (<10) | A (<0.5) |
| Example 42 | Not done | Done | Done | Done | <10 | A (84) | A (0.3) | A (<10) | A (<0.5) |
| Example 43 | Not done | Done | Not done | Done | <10 | A (84) | A (0.3) | A (<10) | A (<0.5) |
| Example 44 | Not done | Done | Not done | Done | <10 | A (84) | A (0.3) | A (<10) | A (<0.5) |
| Comparative Example 1 | Not done | Done | Done | Done | <10 | B (3) | B (3.2) | — | A (<0.5) |
| Comparative Example 2 | Not done | Done | Done | Done | <10 | B (20) | B (2.7) | — | — |

Example 2

The manner was all the same as Example 1 with the exception that the water-repellent compound concentration was set to 1 mass %. As shown in the evaluation result of Table 1, the contact angle after the surface treatment was 68° and therefore the water repellency-providing effect was exhibited. Additionally, the capillary force at the time where water was retained was 1.2 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 3

The manner was all the same as Example 1 with the exception that hexamethyldisilazane [$(CH_3)_3SiNHSi(CH_3)_3$] was used as the water-repellent compound. As shown in the evaluation result of Table 1, the contact angle after the surface treatment was 55° and therefore the water repellency-providing effect was exhibited. Additionally, the capillary force at the time where water was retained was 1.8 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 4

The manner was all the same as Example 1 with the exception that (trifluoropropyl)trichlorosilane [$CF_3CH_2CH_2SiCl_3$] was used as the water-repellent compound. As shown in the evaluation result of Table 1, the contact angle after the surface treatment was 86° and therefore the water repellency-providing effect was excellently exhibited. Additionally, the capillary force at the time where water was retained was 0.2 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 5

The manner was all the same as Example 1 with the exception that (trifluoropropyl)methyldichlorosilane [$CF_3CH_2CH_2Si(CH_3)Cl_2$] was used as the water-repellent compound. As shown in the evaluation result of Table 1, the contact angle after the surface treatment was 84° and therefore the water repellency-providing effect was excellently exhibited. Additionally, the capillary force at the time where water was retained was 0.3 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 6

The manner was all the same as Example 1 with the exception that (trifluoropropyl)dimethylchlorosilane [$CF_3CH_2CH_2Si(CH_3)_2Cl$] was used as the water-repellent compound. As shown in the evaluation result of Table 1, the contact angle after the surface treatment was 70° and therefore the water repellency-providing effect was exhibited. Additionally, the capillary force at the time where water was retained was 1.1 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 7

The manner was all the same as Example 1 with the exception that octadecyldimethylchlorosilane [$C_{18}H_{37}Si(CH_3)_2Cl$] was used as the water-repellent compound. As shown in the evaluation result of Table 1, the contact angle after the surface treatment was 88° and therefore the water repellency-providing effect was excellently exhibited. Additionally, the capillary force at the time where water was retained was 0.1 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 8

The manner was all the same as Example 1 with the exception that trimethylchlorosilane [$(CH_3)_3SiCl$] and trifluoropropyldimethylchlorosilane [$CF_3CH_2CH_2Si(CH_3)_2Cl$] were used as the water-repellent compound at a mass ratio of 50:50 and that the total concentration of the water-repellent compound was 3 mass %. As shown in the evaluation result of Table 1, the contact angle after the surface treatment was 76° and therefore the water repellency-providing effect was exhibited. Additionally, the capillary force at the time where water was retained was 0.8 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 9

The manner was all the same as Example 1 with the exception that hydrofluoroether (HFE-7100 produced by 3M Limited) was used as the organic solvent contained in the water-repellent cleaning liquid. As shown in the evaluation result of Table 1, the contact angle after the surface treatment was 74° and therefore the water repellency-providing effect was exhibited. Additionally, the capillary force at the time where water was retained was 0.9 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 10

The manner was all the same as Example 1 with the exception that a halogen-containing solvent (ZEORORA-H produced by ZEON CORPORATION: 1,1,2,2,3,3,4-heptafluorocyclopentane) was used as the organic solvent contained in the water-repellent cleaning liquid. As shown in the evaluation result of Table 1, the contact angle after the surface treatment was 78° and therefore the water repellency-providing effect was exhibited. Additionally, the capillary force at the time where water was retained was 0.7 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 11

The manner was all the same as Example 1 with the exception that cis-1,2-dichloro-3,3,3-trifluoropropene (DCTFP) was used as the organic solvent contained in the water-repellent cleaning liquid. As shown in the evaluation result of Table 1, the contact angle after the surface treatment was 72° and therefore the water repellency-providing effect was exhibited. Additionally, the capillary force at the time where water was retained was 1.0 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 12

The manner was all the same as Example 1 with the exception that 1-chloro-3,3,3-trifluoropropene (CTFP) was used as the organic solvent contained in the water-repellent cleaning liquid. As shown in the evaluation result of Table 1, the contact angle after the surface treatment was 74° and therefore the water repellency-providing effect was exhibited. Additionally, the capillary force at the time where water was retained was 0.9 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 13

The manner was all the same as Example 9 with the exception that, at the above-mentioned "(3) Surface Treatment of Silicon Wafer Surface by Water-Repellent Cleaning Liquid" the silicon wafer was immersed in 2-propanol for 1 min after being immersed in the water-repellent cleaning liquid and that the silicon wafer was finally taken out of 2-propanol, followed by spraying air thereon to remove 2-propanol from the surface thereby obtaining a wafer provided with a water repellency-provided surface condition. As shown in the evaluation result of Table 1, the contact angle after the surface treatment was 72° and therefore the water repellency-providing effect was exhibited. Additionally, the capillary force at the time where water was retained was 1.0 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 14

The manner was all the same as Example 13 with the exception that DCTFP was used as the organic solvent contained in the water-repellent cleaning liquid. As shown in the evaluation result of Table 1, the contact angle after the surface treatment was 70° and therefore the water repellency-providing effect was exhibited. Additionally, the capillary force at the time where water was retained was 1.1 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 15

The manner was all the same as Example 9 with the exception that, at the above-mentioned "(3) Surface Treatment of Silicon Wafer Surface by Water-Repellent Cleaning Liquid", the silicon wafer was immersed in pure water for 1 min after being immersed in the water-repellent cleaning liquid and that the silicon wafer was finally taken out of the pure water, followed by spraying air thereon thereby obtaining a wafer which is in a water repellency-provided surface condition. As shown in the evaluation result of Table 1, the contact angle after the surface treatment was 74° and therefore the water repellency-providing effect was exhibited. Additionally, the capillary force at the time where water was retained was 0.9 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 16

The manner was all the same as Example 15 with the exception that DCTFP was used as the organic solvent contained in the water-repellent cleaning liquid. As shown in the evaluation result of Table 1, the contact angle after the surface treatment was 72° and therefore the water repellency-providing effect was exhibited. Additionally, the capillary force at the time where water was retained was 1.0 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 17

The manner was all the same as Example 11 with the exception that, at the above-mentioned "(3) Surface Treatment of Silicon Wafer Surface by Water-Repellent Cleaning Liquid", the silicon wafer was immersed in the water-repellent cleaning liquid, followed by spraying air thereon thereby removing the water-repellent cleaning liquid from its surface, and subsequently that the silicon wafer was immersed in 2-propanol for 1 min and pure water for 1 min and finally taken out of the pure water, followed by spraying air thereon to remove the pure water from the surface thereby obtaining a wafer which is in a water repellency-provided surface condition. As shown in the evaluation result of Table 1, the contact angle after the surface treatment was 72° and therefore the water repellency-providing effect was exhibited. Additionally, the capillary force at the time where water was retained was 1.0 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 18

The manner was all the same as Example 11 with the exception that, at the above-mentioned "(3) Surface Treatment of Silicon Wafer Surface by Water-Repellent Cleaning Liquid", the silicon wafer was immersed in the water-repellent cleaning liquid, followed by spraying air thereon thereby removing the water-repellent cleaning liquid from its surface, and subsequently that the silicon wafer was immersed in 2-propanol for 1 min and finally taken out of 2-propanol, followed by spraying air thereon to remove 2-propanol from the surface thereby obtaining a wafer which is in a water repellency-provided surface condition. As shown in the evaluation result of Table 1, the contact angle after the surface treatment was 70° and therefore the water repellency-providing effect was exhibited. Additionally, the capillary force at the time where water was retained was 1.1 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 19

The manner was all the same as Example 11 with the exception that, at the above-mentioned "(3) Surface Treatment of Silicon Wafer Surface by Water-Repellent Cleaning Liquid", the silicon wafer was immersed in the water-repellent cleaning liquid, followed by spraying air thereon to remove the water-repellent cleaning liquid from its surface, and subsequently that the silicon wafer was immersed in pure water for 1 min and finally taken out of the pure water, followed by spraying air thereon to remove the pure water from the surface thereby obtaining a wafer which is in a water repellency-provided surface condition. As shown in the evaluation result of Table 1, the contact angle after the surface treatment was 72° and therefore the water repellency-providing effect was exhibited. Additionally, the capillary force at the time where water was retained was 1.0 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 20

The manner was all the same as Example 9 with the exception that, at the above-mentioned "(3) Surface Treatment of Silicon Wafer Surface by Water-Repellent Cleaning Liquid", air was sprayed on the silicon wafer after taking the silicon wafer out of the water-repellent cleaning liquid thereby obtaining a wafer which is in a water repellency-provided surface condition. As shown in the evaluation result of Table 1, the contact angle after the surface treatment was 74° and therefore the water repellency-providing effect was exhibited. Additionally, the capillary force at the time where water was retained was 0.9 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 21

The manner was all the same as Example 20 with the exception that cis-1,2-dichloro-3,3,3-trifluoropropene (DCTFP) was used as the organic solvent contained in the water-repellent cleaning liquid. As shown in the evaluation result of Table 1, the contact angle after the surface treatment was 72° and therefore the water repellency-providing effect was exhibited. Additionally, the capillary force at the time where water was retained was 1.0 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 22

The manner was all the same as Example 1 with the exception that the silicon wafer was immersed in pure water for 1 min and immersed in 2-propanol (iPA) for 1 min after being immersed in hydrofluoric acid aqueous solution at the above-mentioned "(2) Cleaning of Silicon Wafer". As shown in the evaluation result of Table 1, the contact angle after the surface treatment was 72° and therefore the water repellency-providing effect was exhibited. Additionally, the capillary force at the time where water was retained was 1.0 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 23

The manner was all the same as Example 9 with the exception that the silicon wafer was immersed in pure water for 1 min and immersed in 2-propanol (iPA) for 1 min after being immersed in hydrofluoric acid aqueous solution at the above-mentioned "(2) Cleaning of Silicon Wafer". As shown in the evaluation result of Table 1, the contact angle after the surface treatment was 72° and therefore the water repellency-providing effect was exhibited. Additionally, the capillary force at the time where water was retained was 1.0 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 24

The manner was all the same as Example 11 with the exception that the silicon wafer was immersed in pure water for 1 min and immersed in 2-propanol (iPA) for 1 min after being immersed in hydrofluoric acid aqueous solution at the above-mentioned "(2) Cleaning of Silicon Wafer". As shown in the evaluation result of Table 1, the contact angle after the surface treatment was 70° and therefore the water repellency-providing effect was exhibited. Additionally, the capillary force at the time where water was retained was 1.1 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 25

The manner was all the same as Example 24 with the exception that PGMEA was used as the organic solvent contained in the water-repellent cleaning liquid. As shown in the evaluation result of Table 1, the contact angle after the surface treatment was 66° and therefore the water repellency-providing effect was exhibited. Additionally, the capillary force at the time where water was retained was 1.3 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 26

The manner was all the same as Example 24 with the exception that HFE-7100 and PGMEA were used as organic solvent in the water-repellent cleaning liquid at a mass ratio of 97:3. As shown in the evaluation result of Table 1, the contact angle after the surface treatment was 76° and therefore the water repellency-providing effect was exhibited. Additionally, the capillary force at the time where water was retained was 0.8 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 27

The manner was all the same as Example 13 with the exception that the silicon wafer was immersed in pure water for 1 min and immersed in 2-propanol (iPA) for 1 min after being immersed in hydrofluoric acid aqueous solution at the above-mentioned "(2) Cleaning of Silicon Wafer". As shown in the evaluation result of Table 1, the contact angle after the surface treatment was 70° and therefore the water repellency-providing effect was exhibited. Additionally, the capillary force at the time where water was retained was 1.1 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 28

The manner was all the same as Example 14 with the exception that the silicon wafer was immersed in pure water for 1 min and immersed in 2-propanol (iPA) for 1 min after being immersed in hydrofluoric acid aqueous solution at the above-mentioned "(2) Cleaning of Silicon Wafer". As shown in the evaluation result of Table 1, the contact angle after the surface treatment was 70° and therefore the water repellency-providing effect was exhibited. Additionally, the capillary force at the time where water was retained was 1.1 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 29

The manner was all the same as Example 20 with the exception that the silicon wafer was immersed in pure water for 1 min and immersed in 2-propanol (iPA) for 1 min after being immersed in hydrofluoric acid aqueous solution at the above-mentioned "(2) Cleaning of Silicon Wafer". As shown in the evaluation result of Table 1, the contact angle after the surface treatment was 72° and therefore the water repellency-providing effect was exhibited. Additionally, the capillary force at the time where water was retained was 1.0 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 30

The manner was all the same as Example 21 with the exception that the silicon wafer was immersed in pure water for 1 min and immersed in 2-propanol (iPA) for 1 min after being immersed in hydrofluoric acid aqueous solution at the above-mentioned "(2) Cleaning of Silicon Wafer". As shown in the evaluation result of Table 1, the contact angle after the surface treatment was 72° and therefore the water repellency-providing effect was exhibited. Additionally, the capillary force at the time where water was retained was 1.0 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 31

The manner was all the same as Example 1 with the exception that the silicon wafer was immersed in pure water for 1 min, immersed in 2-propanol (iPA) for 1 min and immersed in toluene for 1 min after being immersed in hydrofluoric acid aqueous solution at the above-mentioned "(2) Cleaning of Silicon Wafer". As shown in the evaluation result of Table 2, the contact angle after the surface treatment was 74° and therefore the water repellency-providing effect was exhibited. Additionally, the capillary force at the time where water was retained was 0.9 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 32

The manner was all the same as Example 9 with the exception that the silicon wafer was immersed in pure water for 1 min, immersed in 2-propanol (iPA) for 1 min and immersed in hydrofluoroether (HFE-7100 produced by 3M Limited) for 1 min after being immersed in hydrofluoric acid aqueous solution at the above-mentioned "(2) Cleaning of Silicon Wafer". As shown in the evaluation result of Table 2, the contact angle after the surface treatment was 74° and therefore the water repellency-providing effect was exhibited. Additionally, the capillary force at the time where water was retained was 0.9 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 33

The manner was all the same as Example 1 with the exception that the silicon wafer was immersed in pure water for 1 min after being immersed in hydrofluoric acid aqueous solution at the above-mentioned "(2) Cleaning of Silicon Wafer". As shown in the evaluation result of Table 2, the contact angle after the surface treatment was 70° and therefore the water repellency-providing effect was exhibited. Additionally, the capillary force at the time where water was retained was 1.1 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 34

The manner was all the same as Example 9 with the exception that the silicon wafer was immersed in pure water for 1 min after being immersed in hydrofluoric acid aqueous solution at the above-mentioned "(2) Cleaning of Silicon Wafer". As shown in the evaluation result of Table 2, the contact angle after the surface treatment was 70° and therefore the water repellency-providing effect was exhibited. Additionally, the capillary force at the time where water was retained was 1.1 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 35

The manner was all the same as Example 23 with the exception that ethyldimethylchlorosilane [$C_2H_5Si(CH_3)_2Cl$] was used as the water-repellent compound. As shown in the evaluation result of Table 2, the contact angle after the surface treatment was 76° and therefore the water repellency-providing effect was exhibited. Additionally, the capillary force at the time where water was retained was 0.8 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 36

The manner was all the same as Example 23 with the exception that propyldimethylchlorosilane [$C_3H_7Si(CH_3)_2Cl$] was used as the water-repellent compound. As shown in the evaluation result of Table 2, the contact angle after the surface treatment was 80° and therefore the water repellency-providing effect was excellently exhibited. Additionally, the capillary force at the time where water was retained was 0.6 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 37

The manner was all the same as Example 3 with the exception that the water-repellent cleaning liquid was obtained by setting the water-repellent compound concentration to 5 mass % and by adding 0.1 mass % trifluoroacetic acid relative to the total quantity of 100 mass % of the water-repellent cleaning liquid. As shown in the evaluation result of Table 2, the contact angle after the surface treatment was 86° and therefore the water repellency-providing effect was exhibited. Additionally, the capillary force at the time where water was retained was 0.2 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 38

The manner was all the same as Example 3 with the exception that the water-repellent cleaning liquid was obtained by setting the water-repellent compound concentration to 5 mass % and by adding 0.1 mass % trifluoroacetic anhydride relative to the total quantity of 100 mass % of the water-repellent cleaning liquid. As shown in the evaluation result of Table 2, the contact angle after the surface treatment was 86° and therefore the water repellency-providing effect was exhibited. Additionally, the capillary force at the time where water was retained was 0.2 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 39

The manner was all the same as Example 37 with the exception that the silicon wafer was immersed in pure water for 1 min and immersed in 2-propanol (iPA) for 1 min after being immersed in hydrofluoric acid aqueous solution at the above-mentioned "(2) Cleaning of Silicon Wafer" and the HFE-7100 and PGMEA were used as the organic solvent contained in the water-repellent cleaning liquid at a mass ratio of 97:3. As shown in the evaluation result of Table 2, the contact angle after the surface treatment was 86° and therefore the water repellency-providing effect was exhibited. Additionally, the capillary force at the time where water was retained was 0.2 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 40

The manner was all the same as Example 38 with the exception that the silicon wafer was immersed in pure water for 1 min and immersed in 2-propanol (iPA) for 1 min after being immersed in hydrofluoric acid aqueous solution at the above-mentioned "(2) Cleaning of Silicon Wafer" and the HFE-7100 and PGMEA were used as the organic solvent contained in the water-repellent cleaning liquid at a mass ratio of 97:3. As shown in the evaluation result of Table 2, the contact angle after the surface treatment was 86° and therefore the water repellency-providing effect was exhibited. Additionally, the capillary force at the time where water was retained was 0.2 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 41

The manner was all the same as Example 39 with the exception that PGMEA was used as the organic solvent contained in the water-repellent cleaning liquid. As shown in the evaluation result of Table 2, the contact angle after the surface treatment was 84° and therefore the water repellency-providing effect was exhibited. Additionally, the capillary force at the time where water was retained was 0.3 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 42

The manner was all the same as Example 40 with the exception that PGMEA was used as the organic solvent contained in the water-repellent cleaning liquid. As shown in the evaluation result of Table 2, the contact angle after the surface treatment was 84° and therefore the water repellency-providing effect was exhibited. Additionally, the capillary force at the time where water was retained was 0.3 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 43

The manner was all the same as Example 41 with the exception that, at the above-mentioned "(3) Surface Treatment of Silicon Wafer Surface by Water-Repellent Cleaning Liquid", the silicon wafer was immersed in 2-propanol for 1 min after being immersed in the water-repellent cleaning liquid and that the silicon wafer was finally taken out of 2-propanol, followed by spraying air thereon to remove 2-propanol from the surface thereby obtaining a wafer provided with a water repellency-provided surface condition. As shown in the evaluation result of Table 2, the contact angle after the surface treatment was 84° and therefore the water repellency-providing effect was exhibited. Additionally, the capillary force at the time where water was retained was 0.3 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 44

The manner was all the same as Example 42 with the exception that, at the above-mentioned "(3) Surface Treatment of Silicon Wafer Surface by Water-Repellent Cleaning Liquid", the silicon wafer was immersed in 2-propanol for 1 min after being immersed in the water-repellent cleaning liquid and that the silicon wafer was finally taken out of 2-propanol, followed by spraying air thereon to remove 2-propanol from the surface thereby obtaining a wafer provided with a water repellency-provided surface condition. As shown in the evaluation result of Table 2, the contact angle after the surface treatment was 84° and therefore the water repellency-providing effect was exhibited. Additionally, the capillary force at the time where water was retained was 0.3 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Comparative Example 1

The manner was the same as Example 1 with the exception that the water-repellent cleaning liquid was not provided to the silicon wafer. In other words, in this Comparative Example, a wafer which is in a surface condition not provided with water repellency was evaluated. As shown in the evaluation result of Table 2, the contact angle of the wafer was 3°, i.e. small, while the capillary force at the time where water was retained was 3.2 MN/m², i.e. large.

Comparative Example 2

The manner was the same as Example 1 with the exception that 3.0 g of trimethylchlorosilane [$(CH_3)_3SiCl$] was mixed with 94.6 g of 2-propanol (iPA), followed by adding 2.4 g of 0.1N nitric acid aqueous solution (pH 1.0) and stirring at room temperature for about 24 hours thereby obtaining a water-repellent cleaning liquid. In other words, in this Comparative Example, a water-repellent cleaning liquid containing a water-repellent compound hydrolyzed at its reactive moiety was used. As shown in the evaluation result of Table 2, the contact angle after the surface treatment was 20°, i.e. small, while the capillary force at the time where water was retained was 2.7 MN/m², i.e. large.

The following Examples 1 to 31 exemplifies a second cleaning agent while the following Comparative Examples 1 and 2 are opposed to the second cleaning agent. Results of these are shown in Table 3.

Example 1

(1) Preparation of Water-Repellent Cleaning Liquid

A mixture of 3 g of trimethylchlorosilane [$(CH_3)_3SiCl$] serving as a water-repellent compound, 10 g of N,N-dimethylformamide serving as a nitrogen containing solvent and 87 g of toluene serving as an organic solvent other than the nitrogen containing solvent was stirred for 5 min thereby obtaining a water-repellent cleaning liquid having: a concentration of the water-repellent compound relative to the total quantity of the water-repellent cleaning liquid (hereinafter referred to as "a water-repellent compound concentration") of 3 mass %; and a concentration of the nitrogen containing solvent relative to the total quantity of the water-repellent cleaning liquid (hereinafter referred to as "a nitrogen-containing compound concentration") of 10 mass %.

(2) Cleaning of Silicon Wafer

An even silicon wafer with a thermal oxide film (A Si wafer having on its surface a thermal oxide film layer of 1 micrometer thickness) was immersed in 1 mass % hydrofluoric acid aqueous solution for 2 min, followed by being immersed in pure water for 1 min and then in acetone for 1 min.

(3) Surface Treatment of Silicon Wafer Surface by Water-Repellent Cleaning Liquid The silicon wafer was immersed in the water-repellent cleaning liquid prepared at the above-mentioned "(1) Preparation of Water-Repellent Cleaning Liquid" at 20° C. for 10 min. Thereafter, the silicon wafer was immersed in 2-propanol for 1 min and then immersed in pure water for 1 min. Finally, the silicon wafer was taken out of the pure water, followed by spraying air thereon, thereby removing the pure water from the surface.

As a result of evaluating the obtained wafer in a manner as discussed in the [Evaluation Method For Silicon Wafer To Which Water-Repellent Cleaning Liquid Is Provided], one having had an initial contact angle of smaller than 10° before a surface treatment changed to have a contact angle of 80° after the surface treatment, as shown in Table 3, thereby exhibiting an excellent water repellency-providing effect. Additionally, as a result of calculating the capillary force at the time where water was retained, the capillary force was 0.6 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

TABLE 3

| | Water-repellent cleaning liquid | | | | | Treatment of water-repellent cleaning liquid | | |
|---|---|---|---|---|---|---|---|---|
| | | | Organic solvent | | | | | |
| | | | Nitrogen- | | | before surface treatment | | |
| | Water-repellent compound | Water-repellent compound concentration [mass %] | Nitrogen-containing solvent | Nitrogen-containing solvent concentration [mass %] | Other organic solvent | Solvent used for cleaning after rinsing with water | Immersion Temperature [° C.] | Immersion Time [min] |
| Example 1 | (CH$_3$)$_3$SiCl | 3 | DMF | 10 | Toluene | Acetone | 20 | 10 |
| Example 2 | (CH$_3$)$_3$SiCl | 1 | DMF | 10 | Toluene | Acetone | 20 | 10 |
| Example 3 | (CH$_3$)$_3$SiCl | 3 | DMF | 2 | Toluene | Acetone | 20 | 10 |
| Example 4 | (CH$_3$)$_3$SiCl | 3 | NMP | 10 | Toluene | Acetone | 20 | 10 |
| Example 5 | CF$_3$CH$_2$CH$_2$Si(CH$_3$)$_2$Cl | 3 | DMF | 10 | Toluene | Acetone | 20 | 10 |
| Example 6 | CF$_3$CH$_2$CH$_2$Si(CH$_3$)Cl$_2$ | 3 | DMF | 10 | Toluene | Acetone | 20 | 10 |
| Example 7 | (CH$_3$)$_3$SiCl | 3 | DMF | 10 | HFE-7100 | Acetone | 20 | 10 |
| Example 8 | (CH$_3$)$_3$SiCl | 3 | DMF | 10 | DCTFP | Acetone | 20 | 10 |
| Example 9 | (CH$_3$)$_3$SiCl | 3 | DMF | 10 | CTFP | Acetone | 20 | 10 |
| Example 10 | (CH$_3$)$_3$SiCl | 3 | DMF | 10 | HFE-7100 | Acetone | 20 | 10 |
| Example 11 | (CH$_3$)$_3$SiCl | 3 | DMF | 10 | DCTFP | Acetone | 20 | 10 |
| Example 12 | (CH$_3$)$_3$SiCl | 3 | DMF | 10 | HFE-7100 | Acetone | 20 | 10 |
| Example 13 | (CH$_3$)$_3$SiCl | 3 | DMF | 10 | DCTFP | Acetone | 20 | 10 |
| Example 14 | (CH$_3$)$_3$SiCl | 3 | DMF | 10 | DCTFP | Acetone | 20 | 10 |
| Example 15 | (CH$_3$)$_3$SiCl | 3 | DMF | 10 | DCTFP | Acetone | 20 | 10 |
| Example 16 | (CH$_3$)$_3$SiCl | 3 | DMF | 10 | DCTFP | Acetone | 20 | 10 |
| Example 17 | (CH$_3$)$_3$SiCl | 3 | DMF | 10 | HFE-7100 | Acetone | 20 | 10 |
| Example 18 | (CH$_3$)$_3$SiCl | 3 | DMF | 10 | DCTFP | Acetone | 20 | 10 |
| Example 19 | (CH$_3$)$_3$SiCl | 3 | DMF | 10 | Toluene | iPA | 20 | 10 |
| Example 20 | (CH$_3$)$_3$SiCl | 3 | DMF | 10 | HFE-7100 | iPA | 20 | 10 |
| Example 21 | (CH$_3$)$_3$SiCl | 3 | DMF | 10 | DCTFP | iPA | 20 | 10 |
| Example 22 | (CH$_3$)$_3$SiCl | 3 | DMF | 10 | HFE-7100 | iPA | 20 | 10 |
| Example 23 | (CH$_3$)$_3$SiCl | 3 | DMF | 10 | DCTFP | iPA | 20 | 10 |
| Example 24 | (CH$_3$)$_3$SiCl | 3 | DMF | 10 | HFE-7100 | iPA | 20 | 10 |
| Example 25 | (CH$_3$)$_3$SiCl | 3 | DMF | 10 | DCTFP | iPA | 20 | 10 |
| Example 26 | (CH$_3$)$_3$SiCl | 3 | DMF | 10 | Toluene | iPA, Toluene | 20 | 10 |
| Example 27 | (CH$_3$)$_3$SiCl | 3 | DMF | 10 | HFE-7100 | iPA, HFE-7100 | 20 | 10 |
| Example 28 | (CH$_3$)$_3$SiCl | 3 | DMF | 10 | Toluene | None | 20 | 10 |
| Example 29 | (CH$_3$)$_3$SiCl | 3 | DMF | 10 | HFE-7100 | None | 20 | 10 |
| Example 30 | C$_2$H$_5$Si(CH$_3$)$_2$Cl | 3 | DMF | 10 | HFE-7100 | iPA | 20 | 10 |
| Example 31 | C$_3$H$_7$Si(CH$_3$)$_2$Cl | 3 | DMF | 10 | HFE-7100 | iPA | 20 | 10 |
| Comparative Example 1 | Not treated | — | — | — | — | Acetone | — | — |
| Comparative Example 2 | Hydrolysate of (CH$_3$)$_3$SiCl | 3 | DMF | 10 | iPA | Acetone | 20 | 10 |

TABLE 3-continued

| | Treatment of water-repellent cleaning liquid after surface treatment | | | | Evaluation results | | | | |
|---|---|---|---|---|---|---|---|---|---|
| | Drying | Cleaning with solvent | Cleaning with water | Drying | Initial contact angle [°] | Contact angle after surface treatment [°] | Capillary force [MN/m²] <calculated value> | Removability of water-repellent surface condition (contact angle [°]) | Surface roughness (Ra [nm]) |
| Example 1 | Not done | Done | Done | Done | <10 | A (80) | A (0.6) | A (<10) | A (<0.5) |
| Example 2 | Not done | Done | Done | Done | <10 | A (72) | A (1.0) | A (<10) | A (<0.5) |
| Example 3 | Not done | Done | Done | Done | <10 | A (78) | A (0.7) | A (<10) | A (<0.5) |
| Example 4 | Not done | Done | Done | Done | <10 | A (74) | A (0.9) | A (<10) | A (<0.5) |
| Example 5 | Not done | Done | Done | Done | <10 | A (80) | A (0.6) | A (<10) | A (<0.5) |
| Example 6 | Not done | Done | Done | Done | <10 | A (74) | A (0.9) | A (<10) | A (<0.5) |
| Example 7 | Not done | Done | Done | Done | <10 | A (80) | A (0.6) | A (<10) | A (<0.5) |
| Example 8 | Not done | Done | Done | Done | <10 | A (78) | A (0.7) | A (<10) | A (<0.5) |
| Example 9 | Not done | Done | Done | Done | <10 | A (78) | A (0.7) | A (<10) | A (<0.5) |
| Example 10 | Not done | Done | Not done | Done | <10 | A (80) | A (0.6) | A (<10) | A (<0.5) |
| Example 11 | Not done | Done | Not done | Done | <10 | A (78) | A (0.7) | A (<10) | A (<0.5) |
| Example 12 | Not done | Not done | Done | Done | <10 | A (80) | A (0.6) | A (<10) | A (<0.5) |
| Example 13 | Not done | Not done | Done | Done | <10 | A (78) | A (0.7) | A (<10) | A (<0.5) |
| Example 14 | Done | Done | Done | Done | <10 | A (80) | A (0.6) | A (<10) | A (<0.5) |
| Example 15 | Done | Done | Not done | Done | <10 | A (80) | A (0.6) | A (<10) | A (<0.5) |
| Example 16 | Done | Not done | Done | Done | <10 | A (80) | A (0.6) | A (<10) | A (<0.5) |
| Example 17 | Done | Not done | Not done | Not done | <10 | A (82) | A (0.5) | A (<10) | A (<0.5) |
| Example 18 | Done | Not done | Not done | Not done | <10 | A (80) | A (0.6) | A (<10) | A (<0.5) |
| Example 19 | Not done | Done | Done | Done | <10 | A (78) | A (0.7) | A (<10) | A (<0.5) |
| Example 20 | Not done | Done | Done | Done | <10 | A (78) | A (0.7) | A (<10) | A (<0.5) |
| Example 21 | Not done | Done | Done | Done | <10 | A (78) | A (0.7) | A (<10) | A (<0.5) |
| Example 22 | Not done | Done | Not done | Done | <10 | A (78) | A (0.7) | A (<10) | A (<0.5) |
| Example 23 | Not done | Done | Not done | Done | <10 | A (76) | A (0.8) | A (<10) | A (<0.5) |
| Example 24 | Done | Not done | Not done | Not done | <10 | A (80) | A (0.6) | A (<10) | A (<0.5) |
| Example 25 | Done | Not done | Not done | Not done | <10 | A (78) | A (0.7) | A (<10) | A (<0.5) |
| Example 26 | Not done | Done | Done | Done | <10 | A (78) | A (0.7) | A (<10) | A (<0.5) |
| Example 27 | Not done | Done | Done | Done | <10 | A (78) | A (0.7) | A (<10) | A (<0.5) |
| Example 28 | Not done | Done | Done | Done | <10 | A (78) | A (0.7) | A (<10) | A (<0.5) |
| Example 29 | Not done | Done | Done | Done | <10 | A (78) | A (0.7) | A (<10) | A (<0.5) |
| Example 30 | Not done | Done | Done | Done | <10 | A (80) | A (0.6) | A (<10) | A (<0.5) |
| Example 31 | Not done | Done | Done | Done | <10 | A (84) | A (0.3) | A (<10) | A (<0.5) |
| Comparative Example 1 | Not done | Done | Done | Done | <10 | B (3) | B (3.2) | — | A (<0.5) |
| Comparative Example 2 | Not done | Done | Done | Done | <10 | B (15) | B (3.1) | — | — |

Example 2

The manner was all the same as Example 1 with the exception that the water-repellent compound concentration was set to 1 mass %. As shown in the evaluation result of Table 3, the contact angle after the surface treatment was 72° and therefore the water repellency-providing effect was exhibited. Additionally, the capillary force at the time where water was retained was 1.0 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 3

The manner was all the same as Example 1 with the exception that the nitrogen-containing compound concentration was set to 2 mass %. As shown in the evaluation result of Table 3, the contact angle after the surface treatment was 78° and therefore the water repellency-providing effect was exhibited. Additionally, the capillary force at the time where water was retained was 0.7 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 4

The manner was all the same as Example 1 with the exception that N-methyl-2-pyrrolidone (NMP) was used as the nitrogen containing solvent. As shown in the evaluation result of Table 3, the contact angle after the surface treatment was 74° and therefore the water repellency-providing effect was exhibited. Additionally, the capillary force at the time where water was retained was 0.9 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 5

The manner was all the same as Example 1 with the exception that (trifluoropropyl)dimethylchlorosilane [$CF_3CH_2CH_2Si(CH_3)_2Cl$] was used as the water-repellent compound. As shown in the evaluation result of Table 3, the contact angle after the surface treatment was 80° and therefore the water repellency-providing effect was excellently exhibited. Additionally, the capillary force at the time where water was retained was 0.6 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 6

The manner was all the same as Example 1 with the exception that (trifluoropropyl)methyldichlorosilane [$CF_3CH_2CH_2Si(CH_3)Cl_2$] was used as the water-repellent compound. As shown in the evaluation result of Table 3, the contact angle after the surface treatment was 74° and therefore the water repellency-providing effect was exhibited. Additionally, the capillary force at the time where water was retained was 0.9 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 7

The manner was all the same as Example 1 with the exception that hydrofluoroether (HFE-7100 produced by 3M Limited) was used as the organic solvent which is other than the nitrogen-containing and contained in the water-repellent cleaning liquid. As shown in the evaluation result of Table 3, the contact angle after the surface treatment was 80° and therefore the water repellency-providing effect was excellently exhibited. Additionally, the capillary force at the time where water was retained was 0.6 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 8

The manner was all the same as Example 1 with the exception that cis-1,2-dichloro-3,3,3-trifluoropropene (DCTFP) was used as the organic solvent which is other than the nitrogen-containing and contained in the water-repellent cleaning liquid. As shown in the evaluation result of Table 3, the contact angle after the surface treatment was 78° and therefore the water repellency-providing effect was exhibited. Additionally, the capillary force at the time where water was retained was 0.7 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 9

The manner was all the same as Example 1 with the exception that 1-chloro-3,3,3-trifluoropropene (CTFP) was used as the organic solvent which is other than the nitrogen-containing and contained in the water-repellent cleaning liquid. As shown in the evaluation result of Table 3, the contact angle after the surface treatment was 78° and therefore the water repellency-providing effect was exhibited. Additionally, the capillary force at the time where water was retained was 0.7 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 10

The manner was all the same as Example 7 with the exception that, at the above-mentioned "(3) Surface Treatment of Silicon Wafer Surface by Water-Repellent Cleaning Liquid", the silicon wafer was immersed in 2-propanol for 1 min after being immersed in the water-repellent cleaning liquid and that the silicon wafer was finally taken out of 2-propanol, followed by spraying air thereon to remove 2-propanol from the surface thereby obtaining a wafer provided with a water repellency-provided surface condition. As shown in the evaluation result of Table 3, the contact angle after the surface treatment was 80° and therefore the water repellency-providing effect was excellently exhibited. Additionally, the capillary force at the time where water was retained was 0.6 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 11

The manner was all the same as Example 10 with the exception that DCTFP was used as the organic solvent which is other than the nitrogen-containing and contained in the water-repellent cleaning liquid. As shown in the evaluation result of Table 3, the contact angle after the surface treatment was 78 and therefore the water repellency-providing effect was exhibited. Additionally, the capillary force at the time where water was retained was 0.7 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 12

The manner was all the same as Example 7 with the exception that, at the above-mentioned "(3) Surface Treatment of Silicon Wafer Surface by Water-Repellent Cleaning Liquid", the silicon wafer was immersed in pure water for 1 min after being immersed in the water-repellent cleaning liquid and that the silicon wafer was finally taken out of the pure water, followed by spraying air thereon thereby obtaining a wafer provided with a water repellency-provided surface condition. As shown in the evaluation result of Table 3, the contact angle after the surface treatment was 80° and therefore the water repellency-providing effect was excellently exhibited. Additionally, the capillary force at the time where water was retained was 0.6 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 13

The manner was all the same as Example 12 with the exception that DCTFP was used as the organic solvent which is other than the nitrogen-containing and contained in the water-repellent cleaning liquid. As shown in the evaluation result of Table 3, the contact angle after the surface treatment was 78 and therefore the water repellency-providing effect was exhibited. Additionally, the capillary force at the time where water was retained was 0.7 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 14

The manner was all the same as Example 8 with the exception that, at the above-mentioned "(3) Surface Treatment of Silicon Wafer Surface by Water-Repellent Cleaning Liquid", the silicon wafer was immersed in the water-repellent cleaning liquid, followed by spraying air thereon to remove the water-repellent cleaning liquid from its surface, and subsequently the silicon wafer was immersed in 2-propanol for 1 min and immersed in pure water for 1 m and finally taken out of the pure water, followed by spraying air thereon to remove the pure water from the surface thereby obtaining a wafer provided with a water repellency-provided surface condition. As shown in the evaluation result of Table 3, the contact angle after the surface treatment was 80° and therefore the water repellency-providing effect was excellently exhibited. Additionally, the capillary force at the time where water was retained was 0.6 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 15

The manner was all the same as Example 8 with the exception that, at the above-mentioned "(3) Surface Treatment of Silicon Wafer Surface by Water-Repellent Cleaning Liquid", the silicon wafer was immersed in the water-repellent cleaning liquid, followed by spraying air thereon to remove the water-repellent cleaning liquid from its surface, and subsequently the silicon wafer was immersed in 2-propanol for 1 min and finally taken out of 2-propanol, followed by spraying air thereon to remove 2-propanol from the surface thereby obtaining a wafer provided with a water repellency-provided surface condition. As shown in the evaluation result of Table 3, the contact angle after the surface treatment was 80° and therefore the water repellency-providing effect was excellently exhibited. Additionally, the capillary force at the time where water was retained was 0.6 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 16

The manner was all the same as Example 8 with the exception that, at the above-mentioned "(3) Surface Treatment of Silicon Wafer Surface by Water-Repellent Cleaning Liquid", the silicon wafer was immersed in the water-repellent cleaning liquid, followed by spraying air thereon to remove the water-repellent cleaning liquid from its surface, and subsequently the silicon wafer was immersed in pure water for 1 min and finally taken out of the pure water, followed by spraying air thereon to remove the pure water from the surface thereby obtaining a wafer provided with a water repellency-provided surface condition. As shown in the evaluation result of Table 3, the contact angle after the surface treatment was 80° and therefore the water repellency-providing effect was excellently exhibited. Additionally, the capillary force at the time where water was retained was 0.6 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 17

The manner was all the same as Example 7 with the exception that, at the above-mentioned "(3) Surface Treatment of Silicon Wafer Surface by Water-Repellent Cleaning Liquid": air was sprayed on the silicon wafer after taking the silicon wafer out of the water-repellent cleaning liquid thereby obtaining a wafer provided with a water repellency-provided surface condition. As shown in the evaluation result of Table 3, the contact angle after the surface treatment was 82° and therefore the water repellency-providing effect was excellently exhibited. Additionally, the capillary force at the time where water was retained was 0.5 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 18

The manner was all the same as Example 17 with the exception that DCTFP was used as the organic solvent which is other than the nitrogen-containing and contained in the water-repellent cleaning liquid. As shown in the evaluation result of Table 3, the contact angle after the surface treatment was 80 and therefore the water repellency-providing effect was excellently exhibited. Additionally, the capillary force at the time where water was retained was 0.6 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 19

The manner was all the same as Example 1 with the exception that the silicon wafer was immersed in pure water for 1 min and immersed in 2-propanol (iPA) for 1 min after being immersed in hydrofluoric acid aqueous solution at the above-mentioned "(2) Cleaning of Silicon Wafer". As shown in the evaluation result of Table 3, the contact angle after the surface treatment was 78 and therefore the water repellency-providing effect was exhibited. Additionally, the capillary force at the time where water was retained was 0.7 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 20

The manner was all the same as Example 19 with the exception that HFE-7100 was used as the organic solvent which is other than the nitrogen-containing and contained in the water-repellent cleaning liquid. As shown in the evaluation result of Table 3, the contact angle after the surface treatment was 78 and therefore the water repellency-providing effect was excellently exhibited. Additionally, the capillary force at the time where water was retained was 0.7 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 21

The manner was all the same as Example 19 with the exception that DCTFP was used as the organic solvent which is other than the nitrogen-containing and contained in the water-repellent cleaning liquid. As shown in the evaluation result of Table 3, the contact angle after the surface treatment was 78 and therefore the water repellency-providing effect was excellently exhibited. Additionally, the capillary force at the time where water was retained was 0.7 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 22

The manner was all the same as Example 10 with the exception that the silicon wafer was immersed in pure water for 1 min and immersed in 2-propanol (iPA) for 1 min after being immersed in hydrofluoric acid aqueous solution at the above-mentioned "(2) Cleaning of Silicon Wafer". As shown in the evaluation result of Table 3, the contact angle after the surface treatment was 78 and therefore the water repellency-providing effect was exhibited. Additionally, the capillary force at the time where water was retained was 0.7 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 23

The manner was all the same as Example 22 with the exception that DCTFP was used as the organic solvent which is other than the nitrogen-containing and contained in the water-repellent cleaning liquid. As shown in the evaluation result of Table 3, the contact angle after the surface treatment was 76 and therefore the water repellency-providing effect was excellently exhibited. Additionally, the capillary force at the time where water was retained was 0.8 MN/m$^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 24

The manner was all the same as Example 17 with the exception that the silicon wafer was immersed in pure water for 1 min and immersed in 2-propanol (iPA) for 1 min after being immersed in hydrofluoric acid aqueous solution at the above-mentioned "(2) Cleaning of Silicon Wafer". As shown in the evaluation result of Table 3, the contact angle after the surface treatment was 80 and therefore the water repellency-providing effect was excellently exhibited. Additionally, the capillary force at the time where water was retained was 0.6 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 25

The manner was all the same as Example 24 with the exception that DCTFP was used as the organic solvent which is other than the nitrogen-containing and contained in the water-repellent cleaning liquid. As shown in the evaluation result of Table 3, the contact angle after the surface treatment was 78 and therefore the water repellency-providing effect was excellently exhibited. Additionally, the capillary force at the time where water was retained was 0.7 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 26

The manner was all the same as Example 1 with the exception that the silicon wafer was immersed in pure water for 1 min, immersed in 2-propanol (iPA) for 1 min and immersed in toluene for 1 min after being immersed in hydrofluoric acid aqueous solution at the above-mentioned "(2) Cleaning of Silicon Wafer". As shown in the evaluation result of Table 3, the contact angle after the surface treatment was 78° and therefore the water repellency-providing effect was exhibited. Additionally, the capillary force at the time where water was retained was 0.7 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 27

The manner was all the same as Example 7 with the exception that the silicon wafer was immersed in pure water for 1 min, immersed in 2-propanol (iPA) for 1 min and immersed in hydrofluoroether (HFE-7100 produced by 3M Limited) for 1 min after being immersed in hydrofluoric acid aqueous solution at the above-mentioned "(2) Cleaning of Silicon Wafer". As shown in the evaluation result of Table 3, the contact angle after the surface treatment was 78° and therefore the water repellency-providing effect was exhibited. Additionally, the capillary force at the time where water was retained was 0.7 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 28

The manner was all the same as Example 1 with the exception that the silicon wafer was immersed in pure water after being immersed in hydrofluoric acid aqueous solution at the above-mentioned "(2) Cleaning of Silicon Wafer". As shown in the evaluation result of Table 3, the contact angle after the surface treatment was 78° and therefore the water repellency-providing effect was exhibited. Additionally, the capillary force at the time where water was retained was 0.7 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 29

The manner was all the same as Example 28 with the exception that HFE-7100 was used as the organic solvent which is other than the nitrogen-containing and contained in the water-repellent cleaning liquid. As shown in the evaluation result of Table 3, the contact angle after the surface treatment was 78 and therefore the water repellency-providing effect was exhibited. Additionally, the capillary force at the time where water was retained was 0.7 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 30

The manner was all the same as Example 20 with the exception that ethyldimethylchlorosilane [$C_2H_5Si(CH_3)_2Cl$] was used as the water-repellent compound. As shown in the evaluation result of Table 3, the contact angle after the surface treatment was 80° and therefore the water repellency-providing effect was excellently exhibited. Additionally, the capillary force at the time where water was retained was 0.6 MN/m² and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Example 31

The manner was all the same as Example 20 with the exception that propyldimethylchlorosilane [$C_3H_7Si(CH_3)_2Cl$] was used as the water-repellent compound. As shown in the evaluation result of Table 3, the contact angle after the surface treatment was 84° and therefore the water repellency-providing effect was excellently exhibited. Additionally, the capillary force at the time where water was retained was 0.3 $MN/m^2$ and therefore the capillary force was small. Additionally, the contact angle after UV irradiation was smaller than 10°, so that removal of the water repellency-provided surface condition was achieved. Furthermore, the Ra value of the wafer after UV irradiation was smaller than 0.5 nm, with which it was confirmed that the wafer was not eroded at the time of cleaning and that the residue of the water-repellent cleaning liquid did not remain after UV irradiation.

Comparative Example 1

The manner was the same as Example 1 with the exception that the water-repellent cleaning liquid was not provided to the silicon wafer. In other words, in this Comparative Example, a wafer which is in a surface condition not provided with water repellency was evaluated. As shown in the evaluation result of Table 3, the contact angle of the wafer was 3, i.e. small, while the capillary force at the time where water was retained was 3.2 $MN/m^2$, i.e. large.

Comparative Example 2

The manner was the same as Example 1 with the exception that 3.0 g of trimethylchlorosilane [$(CH_3)_3SiCl$] was mixed with 10.0 g of N,N-dimethylformamide (DMF) and 84.6 g of 2-propanol (iPA), followed by adding 2.4 g of 0.1N nitric acid aqueous solution (pH 1.0) and stirring at room temperature for about 24 hours thereby obtaining a water-repellent cleaning liquid. In other words, in this Comparative Example, a water-repellent cleaning liquid containing a water-repellent compound hydrolyzed at its reactive moiety was used. As shown in the evaluation result of Table 3, the contact angle after the surface treatment was 15°, i.e. small, while the capillary force at the time where water was retained was 3.1 $MN/m^2$, i.e. large.

EXPLANATION OF REFERENCE NUMERALS

1 Silicon wafer
2 Finely uneven pattern that the silicon wafer has at its surface
3 Projected portions of the pattern
4 Recessed portions of the pattern
5 Width of the recessed portions
6 Height of the projected portions
7 Width of the projected portions
8 Cleaning liquid retained in the recessed portions 4
9 Water-based cleaning liquid retained in the recessed portions 4
10 Surface condition provided with water repellency by a water-repellent compound.

The invention claimed is:
1. A cleaning method for a surface of a silicon wafer, comprising the steps of:
(a) using a cleaning agent for substituting a cleaning liquid retained in recessed portions of a silicon wafer having a finely uneven pattern at its surface with another cleaning liquid,
wherein at least one of the cleaning liquid retained in recessed portions of a silicon wafer having a finely uneven pattern or the another cleaning liquid is retained through the substitution,
wherein the cleaning agent comprises a water-based first cleaning liquid; and a water-repellent second cleaning liquid for imparting water repellency at least to the recessed portions of the uneven pattern during a cleaning process,
wherein the water-repellent second cleaning liquid comprises
a liquid that contains a water-repellent compound having a reactive moiety chemically bondable to Si in the silicon wafer and a hydrophobic group, and an acid catalyst; or
a liquid that contains the water-repellent compound in an amount of 0.1-50 mass % relative to the total quantity of 100 mass % of the water-repellent second cleaning liquid, an organic solvent, and an acid catalyst;
wherein the water-repellent second cleaning liquid is retained in the recessed portions formed at the surface of the silicon wafer to provide said recessed portions with water repellency;
wherein any water retained in the recessed portions has a capillary force not higher than 2.1 $MN/m^2$; and
wherein the water-repellent compound comprises at least one compound selected from the group consisting of compounds represented by formula [2] or compounds represented by formula [3]:

$[R^2Si(CH_3)_{2-d}H_d]_e NH_{3-e}$ [2]

$R^3Si(CH_3)_2Y$ [3]

wherein
$R^2$ is a monovalent organic group having a hydrocarbon group with a carbon number of 1 to 18 or a monovalent organic group having perfluoroalkyl chain with a carbon number of 1 to 8;
d is an integer of from 0 to 2;
e is an integer of from 1 to 3;
$R^3$ is a monovalent organic group having a hydrocarbon group with a carbon number of 1 to 18 or a monovalent organic group having perfluoroalkyl chain with a carbon number of 1 to 8; and
Y represents a monovalent organic group whose element to be bonded to Si is nitrogen;
(b) bringing the silicon wafer into contact with the water-based first cleaning liquid; and
(c) thereafter bringing the silicon wafer into contact with the water-repellent second cleaning liquid.
2. A cleaning method for a surface of a silicon wafer, comprising the steps of:
(a) using a cleaning agent for substituting a cleaning liquid retained in recessed portions of a silicon wafer having a finely uneven pattern at its surface with another cleaning liquid, wherein at least one of the cleaning liquid retained in recessed portions of a silicon wafer having a finely uneven pattern or the another cleaning liquid is retained through the substitution, wherein the cleaning agent comprises two or more cleaning liquids, wherein the cleaning agent comprises a water-based first cleaning liquid and a water-repellent second cleaning liquid for providing at least the recessed portion of the uneven pattern with water repellency during a cleaning process, wherein the water-repellent second cleaning liquid is selected from the group consisting of:

a liquid comprising a water-repellent compound having a hydrophobic group and a reactive moiety chemically bondable to Si in the silicon wafer; and a liquid that contains the water-repellent compound in an amount of 0.1-50 mass % relative to the total quantity of 100 mass % of the water-repellent second cleaning liquid and an organic solvent wherein the water-repellent second cleaning liquid is retained in the recessed portions formed at the surface of the silicon wafer to provide said recessed portions with water repellency;

wherein any water retained in the recessed portions has a capillary force not higher than 2.1 $MN/m^2$; and (b) removing the cleaning agent from the surface of the silicon wafer after removing the cleaning liquid from the surface of the silicon wafer, wherein the water-repellent compound and the organic solvent are mixed and contained in the water-repellent second cleaning liquid, wherein the water-repellent compound is mixed and contained in the water-repellent second cleaning liquid in an amount of 0.1-50 mass % relative to the total quantity of 100 mass % of the water-repellent second cleaning liquid, wherein the organic solvent contains a nitrogen-containing solvent, and wherein the nitrogen-containing solvent comprises a carbon atom bonded to a nitrogen atom.

3. A cleaning method as claimed in claim 2 wherein the nitrogen-containing solvent is at least one selected from the group consisting of tertiary amide, tertiary amine, 1-alkyl-2-pyrrolidone and compounds having pyridine ring.

4. A cleaning method for a surface of a silicon wafer, comprising the steps of:

(a) using a cleaning agent for substituting a cleaning liquid retained in recessed portions of a silicon wafer having a finely uneven pattern at its surface with another cleaning liquid, wherein at least one of the cleaning liquid retained in recessed portions of a silicon wafer having a finely uneven pattern or the another cleaning liquid is retained through the substitution, wherein the cleaning agent comprises two or more cleaning liquids, wherein the cleaning agent comprises a water-based first cleaning liquid and a water-repellent second cleaning liquid for providing at least the recessed portion of the uneven pattern with water repellency during a cleaning process, wherein the water-repellent second cleaning liquid is selected from the group consisting of:

a liquid comprising a water-repellent compound having a hydrophobic group and a reactive moiety chemically bondable to Si in the silicon wafer; and a liquid that contains the water-repellent compound in an amount of 0.1-50 mass % relative to the total quantity of 100 mass % of the water-repellent second cleaning liquid and an organic solvent;

wherein the water-repellent second cleaning liquid is retained in the recessed portions formed at the surface of the silicon wafer to provide said recessed portions with water repellency;

wherein any water retained in the recessed portions has a capillary force not higher than 2.1 $MN/m^2$; and (b) removing the cleaning agent from the surface of the silicon wafer after removing the cleaning liquid from the surface of the silicon wafer, wherein the organic solvent mixed with the water-repellent compound is a halogen-containing uninflammable solvent.

5. A cleaning method as claimed in claim 1, further comprising a step of removing the cleaning liquid retained in the recessed portions from the recessed portions by drying.

6. A cleaning method as claimed in claim 5, further comprising a step of irradiating the surface of the silicon wafer with light or heating the silicon wafer.

7. A cleaning method for a surface of a silicon wafer, comprising the steps of:

(a) using a cleaning agent for substituting a cleaning liquid retained in recessed portions of a silicon wafer having a finely uneven pattern at its surface with another cleaning liquid, wherein at least one of the cleaning liquid retained in recessed portions of a silicon wafer having a finely uneven pattern or the another cleaning liquid is retained through the substitution, wherein the cleaning agent comprises two or more cleaning liquids, wherein the cleaning agent comprises a water-based first cleaning liquid and a water-repellent second cleaning liquid for providing at least the recessed portion of the uneven pattern with water repellency during a cleaning process, wherein the water-repellent second cleaning liquid is selected from the group consisting of:

a liquid comprising a water-repellent compound having a hydrophobic group and a reactive moiety chemically bondable to Si in the silicon wafer; and a liquid that contains the water-repellent compound in an amount of 0.1-50 mass % relative to the total quantity of 100 mass % of the water-repellent second cleaning liquid and an organic solvent;

wherein the water-repellent second cleaning liquid is retained in the recessed portions formed at the surface of the silicon wafer to provide said recessed portions with water repellency;

wherein any water retained in the recessed portions has a capillary force not higher than 2.1 $MN/m^2$; and wherein the water-repellent compound and the organic solvent are mixed and contained in the water-repellent second cleaning liquid, wherein the water-repellent compound is mixed and contained in the water-repellent second cleaning liquid in an amount of 0.1-50 mass % relative to the total quantity of 100 mass % of the water-repellent second cleaning liquid, wherein the organic solvent contains a nitrogen-containing solvent, and wherein the nitrogen-containing solvent comprises a carbon atom bonded to a nitrogen atom.

8. A cleaning method as claimed in claim 7, further comprising a step of removing the cleaning liquid retained in the recessed portions from the recessed portions by drying.

* * * * *